United States Patent
Okamoto et al.

(10) Patent No.: US 7,105,916 B2
(45) Date of Patent: Sep. 12, 2006

(54) INLET FOR AN ELECTRONIC TAG

(75) Inventors: Michio Okamoto, Machida (JP); Yuichi Morinaga, Fuchu (JP); Yuji Ikeda, Hinode (JP); Takeshi Saito, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 119 days.

(21) Appl. No.: 10/634,751

(22) Filed: Aug. 6, 2003

(65) Prior Publication Data

US 2004/0041262 A1 Mar. 4, 2004

(30) Foreign Application Priority Data

Aug. 28, 2002 (JP) ............... 2002-247990

(51) Int. Cl.
*H01L 23/495* (2006.01)
(52) U.S. Cl. .............. 257/666; 257/668; 257/675; 257/E23.049; 257/E23.055
(58) Field of Classification Search ........... 257/675, 257/666, 674, 668
See application file for complete search history.

(56) References Cited

U.S. PATENT DOCUMENTS

| | | | | |
|---|---|---|---|---|
| 4,783,646 A | * | 11/1988 | Matsuzaki | 340/572.5 |
| 5,786,626 A | * | 7/1998 | Brady et al. | 257/673 |
| 5,826,328 A | * | 10/1998 | Brady et al. | 29/827 |
| 5,903,239 A | * | 5/1999 | Takahashi et al. | 343/700 MS |
| 5,973,600 A | * | 10/1999 | Mosher, Jr. | 340/572.8 |
| 6,060,959 A | * | 5/2000 | Yakuwa | 333/26 |

FOREIGN PATENT DOCUMENTS

JP 10-13296 1/1998

\* cited by examiner

*Primary Examiner*—Michael Lebentritt
*Assistant Examiner*—Ron Pompey
(74) *Attorney, Agent, or Firm*—Miles & Stockbridge PC

(57) ABSTRACT

Provided are an inlet for an electronic tag comprising an insulating film, antennas each made of a conductor layer and formed over one surface of the insulating film, a slit formed in a portion of each of the antennas and having one end extending toward the outer edge of the antenna, a semiconductor chip electrically connected with each of the antennas via a plurality of bump electrodes, and a resin for sealing the semiconductor chip therewith; and a manufacturing process of the inlet. By the present invention, formation of a thin and highly-reliable inlet for a non-contact type electronic tag can be actualized.

19 Claims, 33 Drawing Sheets

INLET FOR AN ELECTRONIC TAG

BACKGROUND OF THE INVENTION

The present invention relates to an inlet for a non-contact type electronic tag, particularly to a technique effective when applied to thinning and reliability increase of the inlet for an electronic tag.

A non-contact type electronic tag is a device capable of storing desired information in a memory circuit of a semiconductor chip and from the tag, the necessary information is read by means of microwaves.

One example of such a non-contact type electronic tag is disclosed in Japanese Patent Laid-Open No. Hei 10(1998)-13296 (Patent Document 1). The electronic tag has a microwave receiving antenna formed of a lead frame on which a packaged semiconductor chip has been sealed with a resin.

[Patent Document 1]
Japanese Patent Laid-Open No. Hei 10(1998)-13296

SUMMARY OF THE INVENTION

An electronic tag has an advantage of storing large volumes of data compared with a tag using a bar code, because the electronic tag stores data in a memory circuit of a semiconductor chip. Another advantage is that the data stored in the memory circuit cannot be falsified easily compared with the data stored in the bar code.

Such an electronic tag however has a structure more complex than that of the tag using a bar code and its manufacturing cost inevitably increases, which has been one cause for preventing popular use of the electronic tag.

The present inventors have therefore proceeded with the development of an inlet for an electronic tag which has a simplified structure and therefore can be produced at a lower cost. This inlet has a structure in which a semiconductor chip is mounted on an antenna formed of a lead frame, the antenna is electrically connected to the semiconductor chip via an Au wire and the semiconductor chip and Au wire are sealed with a potting resin.

In the above-described inlet, however, the antenna formed of a lead frame and the semiconductor chip are connected via an Au wire. When the semiconductor chip and the Au wire are sealed with a potting resin, the total inlet thickness inevitably reaches about 0.6 mm, which causes problems that the resulting inlet cannot satisfy the demand for thinning, or cannot have sufficient flexibility against bending deformation at the antenna part.

An object of the present invention is to provide a technique capable of actualizing thinning and reliability increase of an inlet for an electronic tag.

Another object of the present invention is to provide a technique capable of actualizing an inlet tag for an electronic tag which is thin, highly flexible and inexpensive.

The above-described and the other objects, and novel features of the present invention will become apparent from the description herein and accompanying drawings.

The outline of the typical inventions, among the inventions disclosed by the present application, will next be explained briefly.

An inlet for an electronic tag according to the present invention is equipped with an insulating film, an antenna made of a conductor layer and formed over one surface of the insulating film, a slit formed in a portion of the antenna and having one end extending to the outer edge of the antenna, a semiconductor chip electrically connected to the antenna via a plurality of bump electrodes, and a resin for sealing the semiconductor chip therewith.

In the above-described inlet for an electronic tag according to the present invention, a cutout for exposing the insulating film is disposed in a portion of the antenna; a plurality of lead patterns made of the conductor film is disposed inside of the cutout, each having one end connected to the antenna and the other end extending inside of the cutout; and the plurality of bump electrodes are connected respectively to the surfaces of the lead patterns formed at positions corresponding to the bump electrodes.

A manufacturing process of the inlet for an electronic tag comprises (a) preparing a long insulating film in which a plurality of antennas made of a conductor layer are formed so as to be separated from each other; (b) connecting semiconductor chips to the plurality of antennas formed in the insulating film, respectively; (c) sealing the semiconductor chips connected respectively to the plurality of antennas with a resin; and (d) checking the quality of the inlet for an electronic tag manufactured by the steps (a), (b) and (c), wherein the long insulating film is carried from the step (a) to the step (d) while being wound onto a reel.

DETAILED DESCRIPTION OF THE INVENTION

Figure 1:
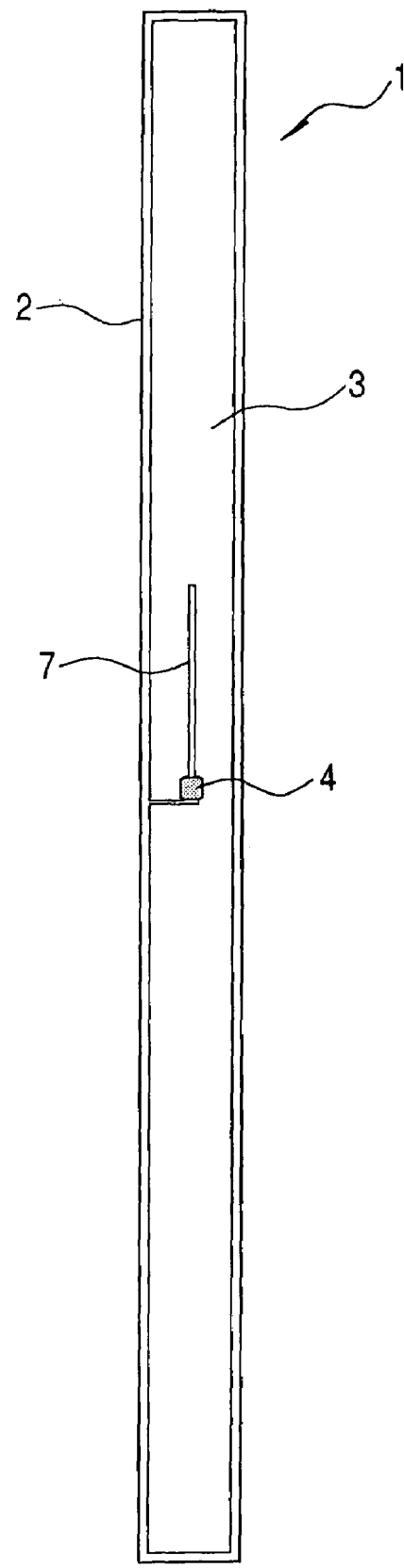
FIG. 1 is a plan view (on the surface side) illustrating an inlet for an electronic tag according to one embodiment of the present invention.

The embodiments of the present invention will hereinafter be described specifically based on accompanying drawings. In all the drawings for describing the below-described embodiments, members having like function will be identified by like reference numerals and overlapping descriptions will be omitted.

EMBODIMENT 1

Figure 2:
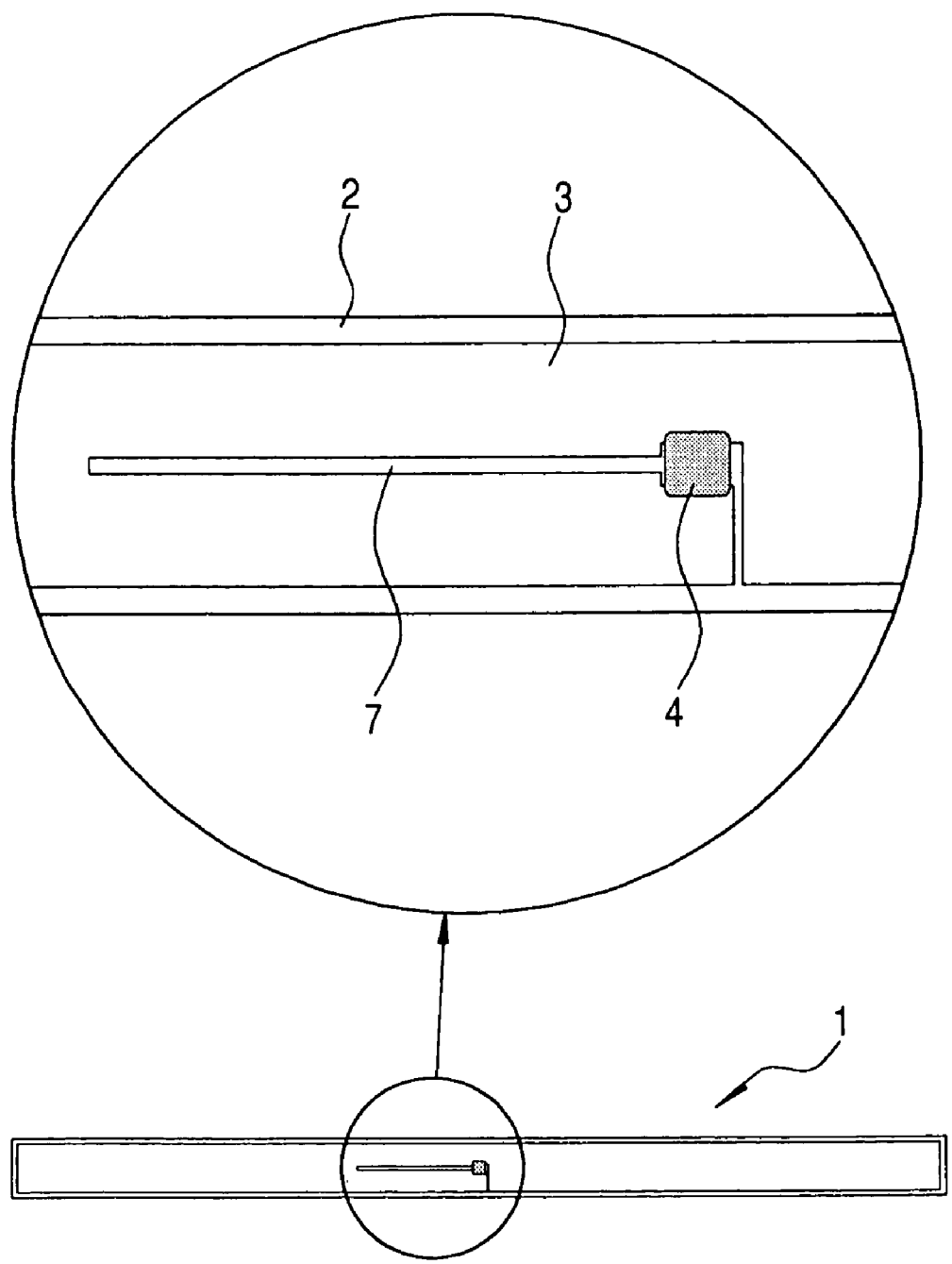
FIG. 2 is a plan view in which a portion of FIG. 1 is illustrated in an enlarged form.
Figure 3:
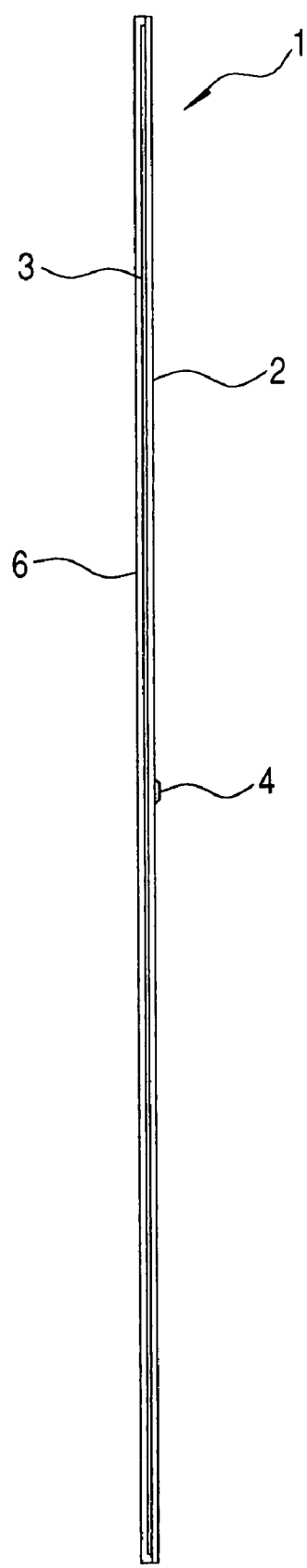
FIG. 3 is a side view illustrating the inlet for an electronic tag according to the one embodiment of the present invention.
Figure 4:
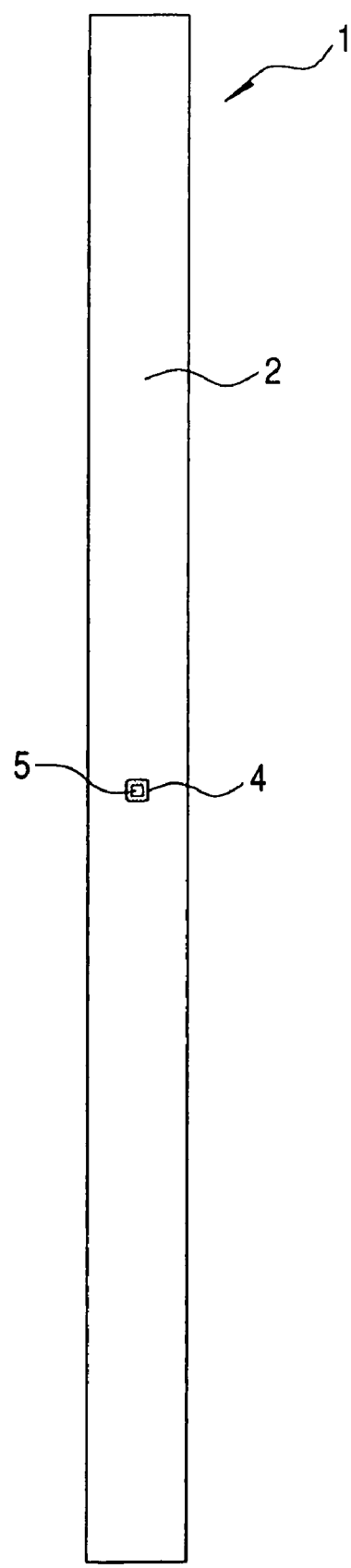
FIG. 4 is a plan view (on the back side) illustrating the inlet for an electronic tag according to the one embodiment of the present invention.
Figure 5:
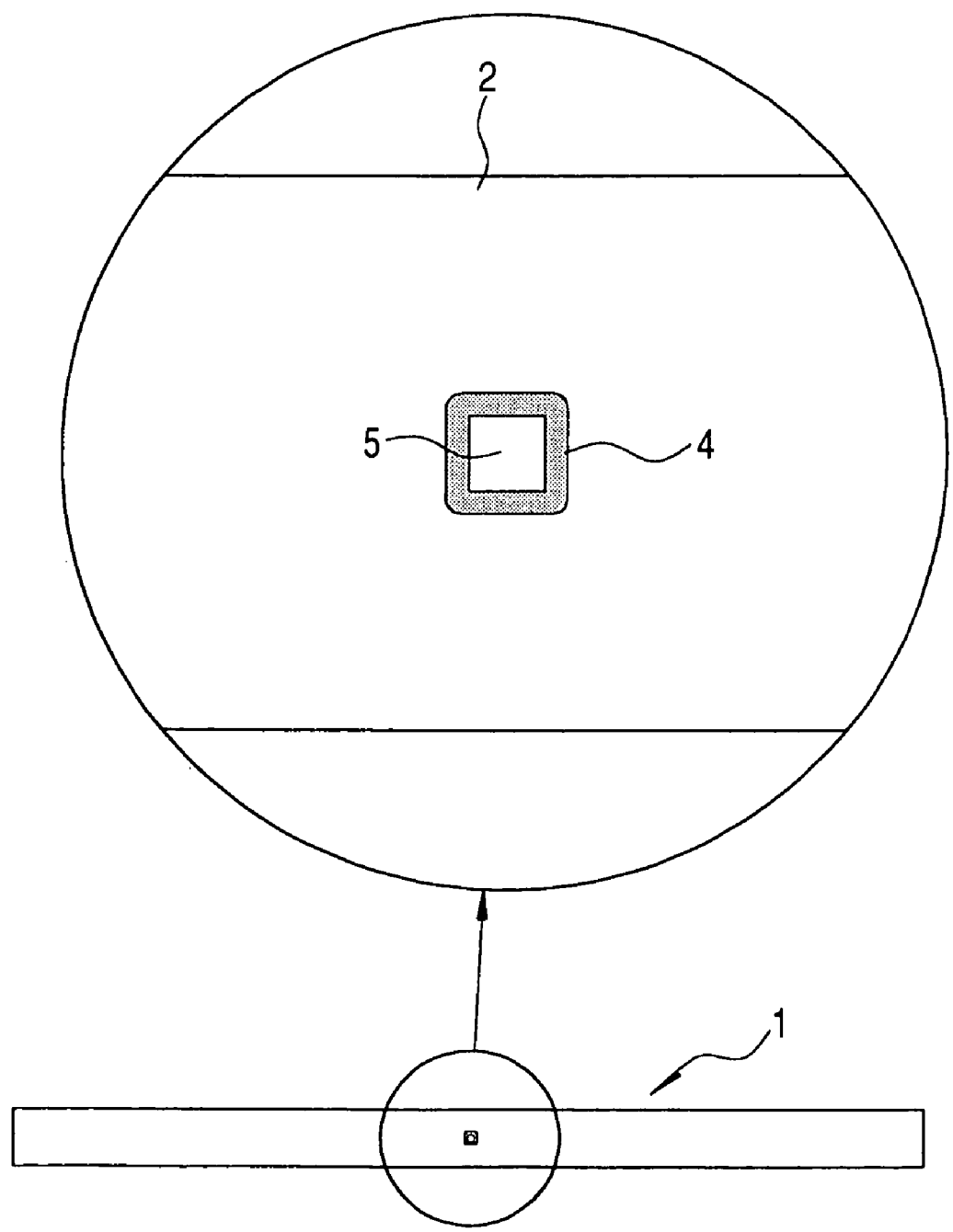
FIG. 5 is a plan view in which a portion of FIG. 4 is illustrated in an enlarged form.

FIG. 1 is a plan view (on the surface side) illustrating an inlet for an electronic tag according to this embodiment of the present invention; FIG. 2 is a plan view in which a portion of FIG. 1 is illustrated in an enlarged form; FIG. 3 is a side view illustrating the inlet for an electronic tag according to this embodiment of the present invention; FIG. 4 is a plan view (on the back side) illustrating the inlet for an electronic tag according to this embodiment of the present invention; and FIG. 5 is a plan view in which a portion of FIG. 4 is illustrated in an enlarged form.

The inlet for electronic tag (which will hereinafter be called "inlet" simply) according to this embodiment constitutes a main portion of a non-contact type electronic tag equipped with antennas for receiving microwaves. This inlet 1 has an antenna 3 made of a Cu foil adhered onto one surface of a long rectangular insulating film 2, and a semiconductor chip 5 connected to the antenna 3 while being sealed, on the surface and side surfaces of the semiconductor chip, with a potting resin 4. On the one surface (the surface on which the antenna 3 is formed) of the insulating film 2, a cover film 6 for protecting the antenna 3 or the semiconductor chip 5 is laminated as needed.

The antenna 3 along the long side direction of the insulating film 2 is, for example, 56 mm and its length is optimized so as to efficiently receive microwaves having a wavelength of 2.45 GHz. The width of the antenna 3 is 3 mm and is optimized to attain both a size reduction and maintenance of the strength of the inlet 1.

At the approximate center of the antenna 3, an L-shape slit 7 having one end reaching the outer edge of the antenna 3 is formed. In this slit 7, the semiconductor chip 5 sealed with the potting resin 4 is mounted.

Figure 6:
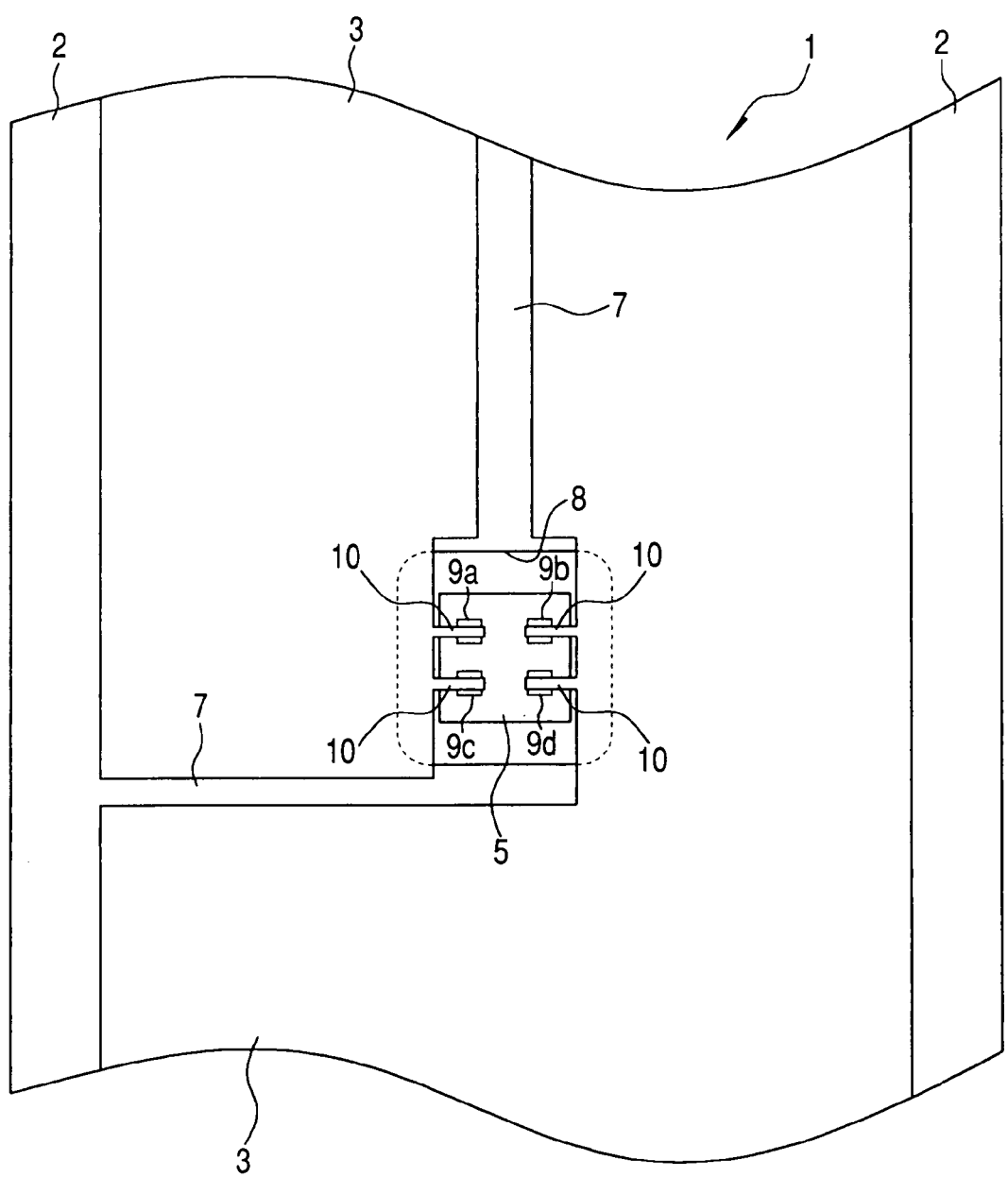
FIG. 6 is a fragmentary enlarged plan view (on the surface side) illustrating the inlet for an electronic tag according to the one embodiment of the present invention.
Figure 7:
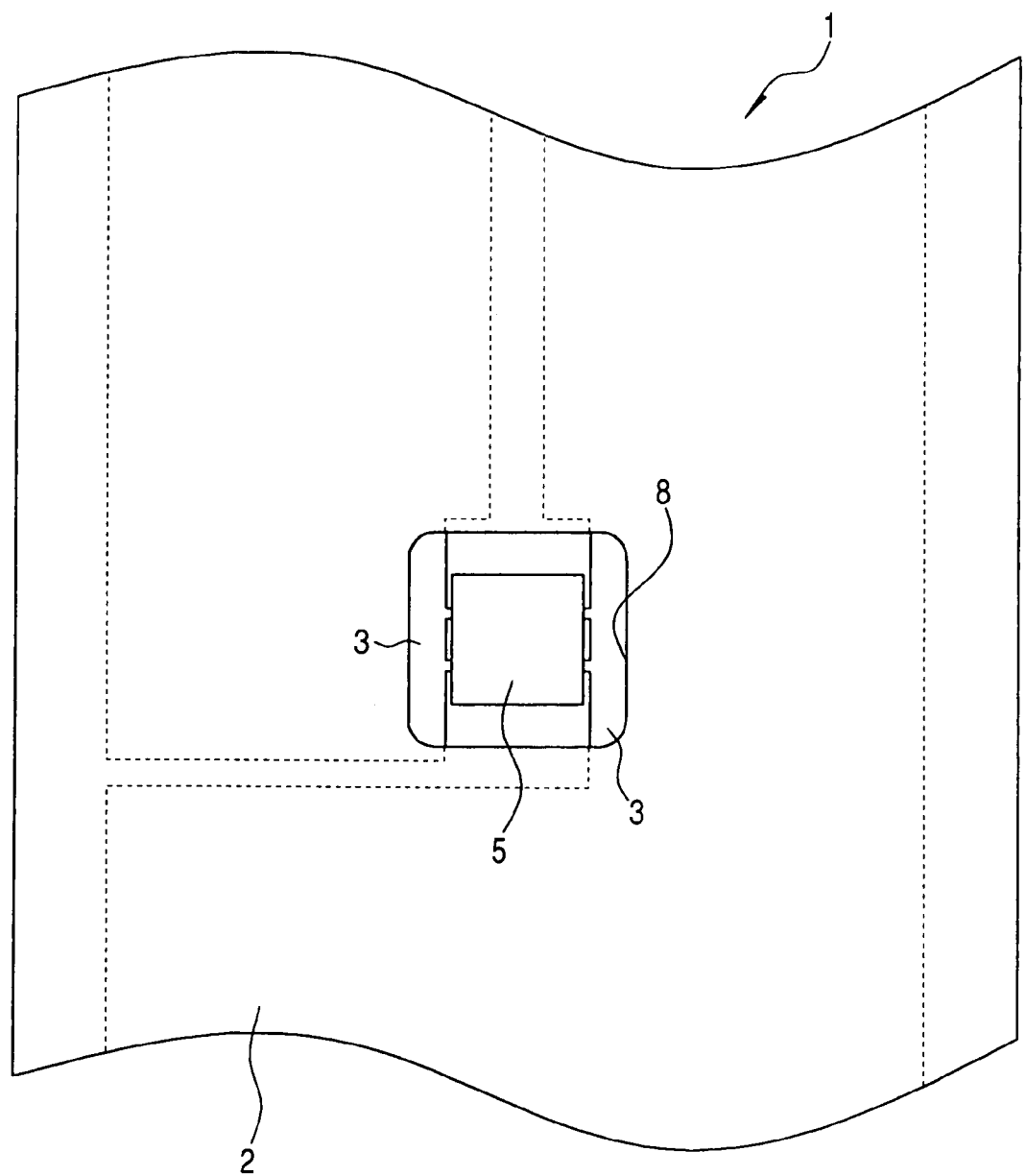
FIG. 7 is a fragmentary enlarged plan view (on the back side) illustrating the inlet for the electronic tag according to the one embodiment of the present invention.

FIGS. 6 and 7 are each an enlarged plan view illustrating the vicinity of the center of the antenna 3 at which the slit 7 has been formed. FIG. 6 and FIG. 7 illustrate the surface side and back side of the inlet 1, respectively. From these drawings, the potting resin 4 for sealing the semiconductor chip 5 therewith and cover film 6 are omitted.

As illustrated, in the slit 7, a device hole 8 is formed by cutting out a portion of the insulating film 2. The semiconductor chip 5 is disposed at the center of this device hole 8.

The device hole 8 is, for example, 0.8 mm by 0.8 mm, while the semiconductor chip 5 is, for example, 0.48 mm by 0.48 mm.

As illustrated in FIG. 6, over the main surface of the semiconductor chip 5, for example, four Au bumps 9a, 9b, 9c and 9d are formed. To these Au bumps 9a, 9b, 9c and 9d, leads 10 formed integral with the antenna 3 and having one end extending inside of the device hole 8 are connected.

Of the four leads 10, two leads 10 extend to the inside of the device hole 8 from one half of the antenna 3 divided by the slit 7 and are electrically connected to the Au bumps 9a and 9c of the semiconductor chip 5. The other two leads 10 extend inside of the device hole 8 from the other half of the antenna 3 and are electrically connected to the Au bumps 9b and 9d of the semiconductor chip 5.

Figure 8:
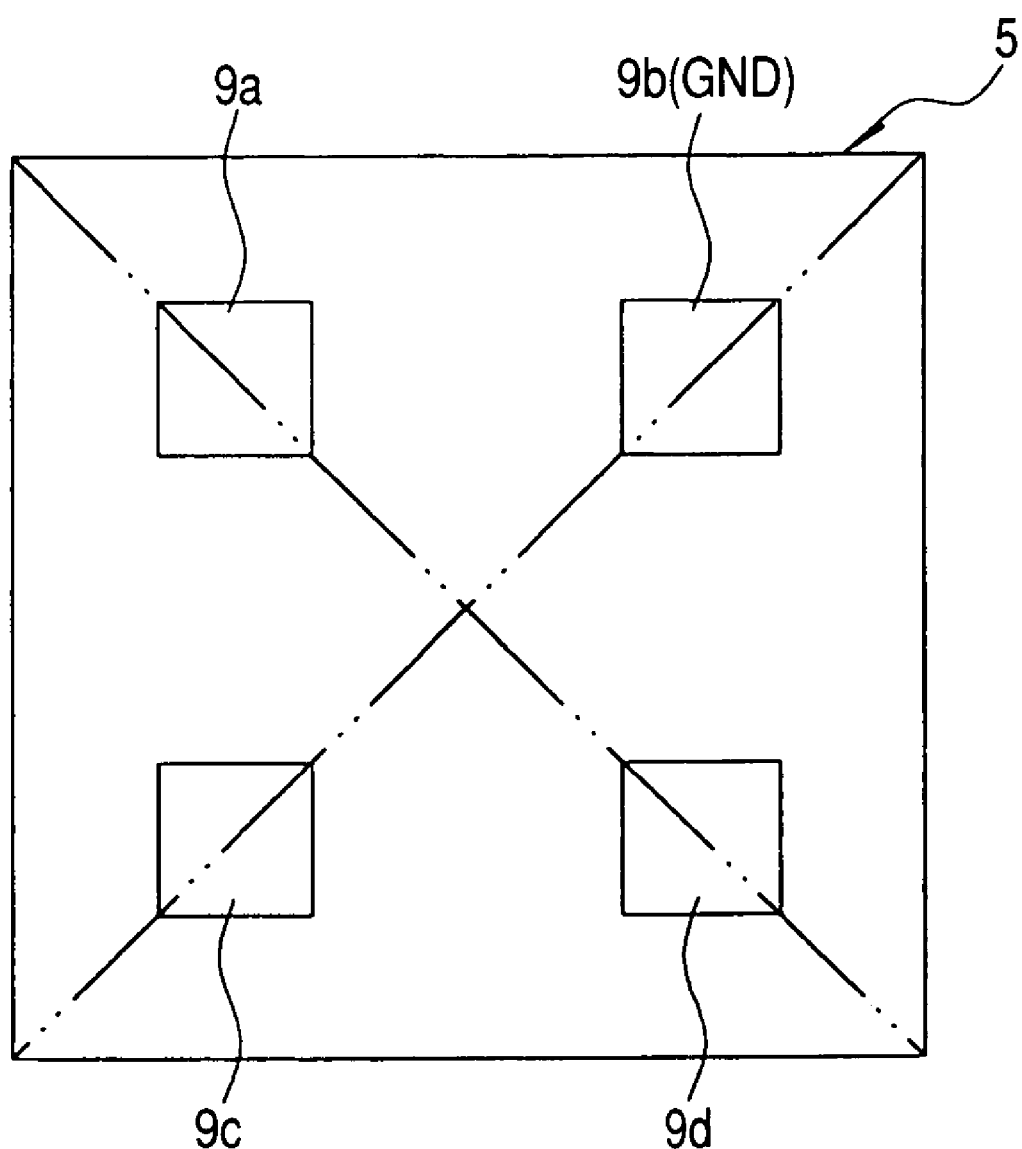
FIG. 8 is a plan view of a semiconductor chip mounted on the inlet for an electronic tag according to the one embodiment of the present invention.
Figure 9:
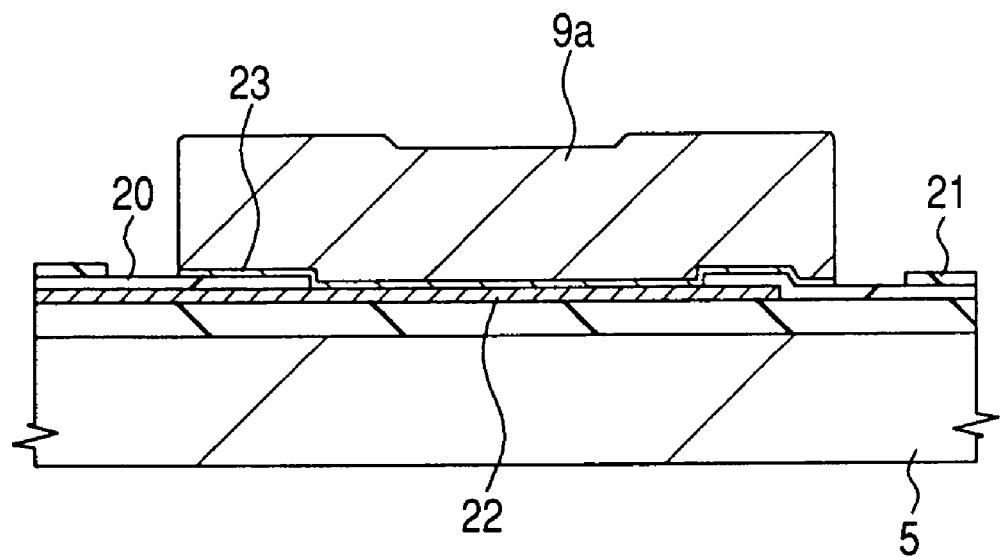
FIG. 9 is a cross-sectional view of a bump electrode formed over the main surface of the semiconductor chip as illustrated in FIG. 8 and the vicinity of the bump electrode.
Figure 10:
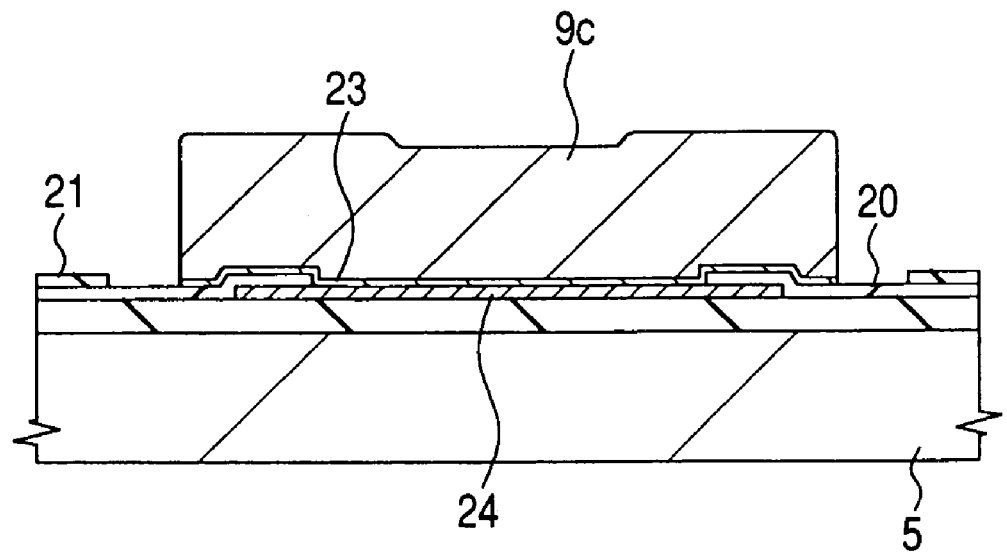
FIG. 10 is a cross-sectional view of a dummy bump electrode formed over the main surface of the semiconductor chip as illustrated in FIG. 8 and the vicinity of the electrode.
Figure 11:
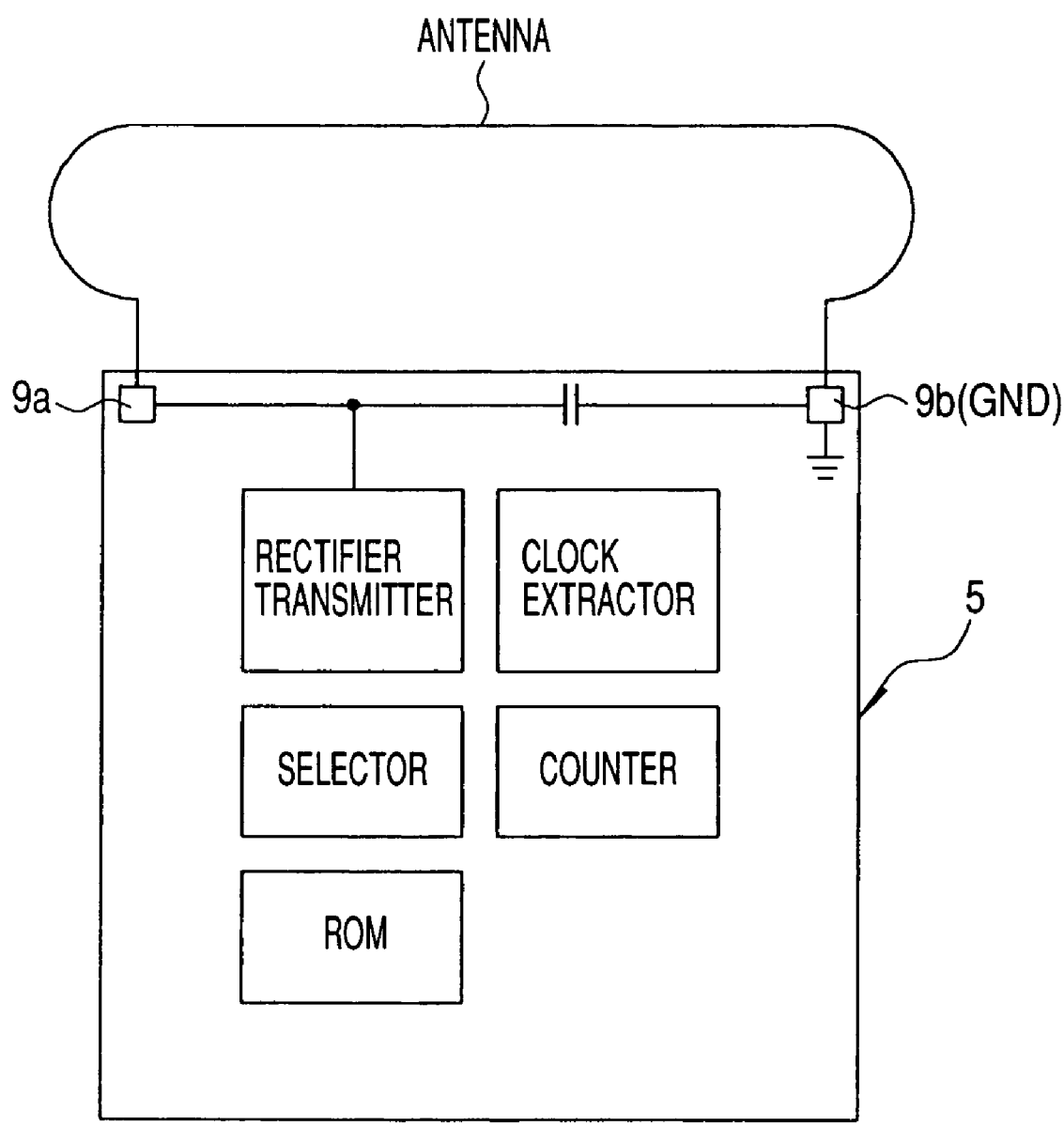
FIG. 11 is a block diagram of a circuit formed over the main surface of the semiconductor chip illustrated in FIG. 8.

FIG. 8 is a plan view illustrating the layout of the four Au bumps 9a, 9b, 9c and 9d formed over the main surface of the semiconductor chip 5; FIG. 9 is an enlarged cross-sectional view of the vicinity of the Au bump 9a; FIG. 10 is an enlarged cross-sectional view of the vicinity of the Au bump 9c; and FIG. 11 is a block diagram of a circuit formed over the semiconductor chip 5.

The semiconductor chip 5 is made of a single crystal silicon substrate having a thickness of about 0.15 mm and has, on the main surface thereof, a circuit made of, for example, a rectifier·transmitter, clock extractor, selector, counter and ROM. The ROM has a memory capacity of 128 bit and is capable of storing a higher capacity of data compared with a storage medium such as bar code. Another advantage of the ROM over the bar code is that data stored in ROM cannot easily be falsified compared with the data stored in the bar code.

Over the main surface of the semiconductor chip 5 having the above-described circuit formed thereon, four Au bumps 9a, 9b, 9c and 9d are formed. These four Au bumps 9a, 9b, 9c and 9d exist on a pair of virtual diagonals as illustrated by the chain double-dashed line of FIG. 8 and at the same time, they are disposed so that their distances from the intersect of these diagonals will be substantially equal each other. These Au bumps 9a, 9b, 9c and 9d are formed, for example, by the known electroplating method and their height is, for example, about 15 μm.

The layout of these Au bumps 9a, 9b, 9c and 9d is not limited to that illustrated in FIG. 8, but that facilitating balancing against a weight increase upon chip connection is preferred. For example, in a plane layout, a polygon formed by the tangent lines of Au bumps is preferably disposed so that it surrounds the center of the chip.

Among the four Au bumps 9a, 9b, 9c and 9d, the Au bump 9a, for example, constitutes an input terminal of the circuit illustrated in FIG. 11 and the Au bump 9b constitutes a GND terminal. The remaining two Au bumps 9c and 9d constitute a dummy bump which is not connected to the above-described circuit.

As illustrated in FIG. 9, the Au bump 9a constituting the input terminal of the circuit is formed over an uppermost-level metal interconnect 22 exposed by etching of a passivation film 20 covering the main surface of the semiconductor chip 5 and a polyimide resin 21. Between the Au bump 9a and the uppermost-level metal interconnect 22, a barrier metal film 23 is formed in order to heighten the adhesive force therebetween. The passivation film 20 is made of, for example, a laminate of a silicon oxide film and a silicon nitride film, while the uppermost-level metal interconnect 22 is made of, for example, an Al alloy film. The barrier metal film 23 is made of, for example, a Ti film having a high adhesive force to the Al alloy film and a Pd film having a high adhesive force to the Au bump 9a. The Au bump 9b constituting the GND terminal of the circuit and the uppermost-level metal interconnect 22 also have a similar constitution at the connection therebetween, which however is not illustrated here. As illustrated in FIG. 10, the Au bump 9c (and 9d) constituting a dummy bump is connected to the metal layer 24 formed over the same interconnect layer with the uppermost-level metal interconnect 22. This metal layer 24 however is not connected to the above-described circuit.

Thus, in the inlet 1 of this Embodiment, the slit 7 having one end reaching the outer edge of the antenna 3 is disposed in a portion of the antenna 3 formed over one surface of the insulating film 2; and the input terminal (Au bump 9a) of the semiconductor chip 5 is connected to one half of the antenna 3 divided into two by the slit 7, while the GND terminal (Au bump 9b) of the semiconductor chip 5 is connected to the other half. This constitution makes it possible to increase the actual effective length of the antenna 3, thereby reducing the size of the inlet 1 while keeping a necessary antenna length.

In the inlet 1 of this Embodiment, Au bumps 9a and 9b constituting the terminals of the circuit and dummy Au bumps 9c and 9d are disposed on the main surface of the semiconductor chip 5, and these four Au bumps 9a, 9b, 9c and 9d are connected to the corresponding leads 10 of the antenna 3, respectively. By this constitution, the effective contact area of the Au bumps with the leads 10 can be made greater than the constitution in which only the two Au bumps 9a and 9b connected to the circuit are connected to the corresponding leads 10, leading to an improvement in the adhesion strength between the Au bumps and leads 10, that is, connection reliability of them. In addition, by disposing the four Au bumps 9a, 9b, 9c and 9d on the main surface of the semiconductor chip 5 according to the layout as illustrated in FIG. 8, the semiconductor chip 5 never leans to the insulating film 2 when the leads 10 are connected to the Au bumps 9a, 9b, 9c and 9d. This makes it possible to seal the semiconductor chip 5 with the potting resin 4 without failure, resulting in an improvement in the production yield of the inlet 1.

A manufacturing process of the inlet 1 having the above-described constitution will next be described based on FIGS. 12 to 20.

Figure 12:
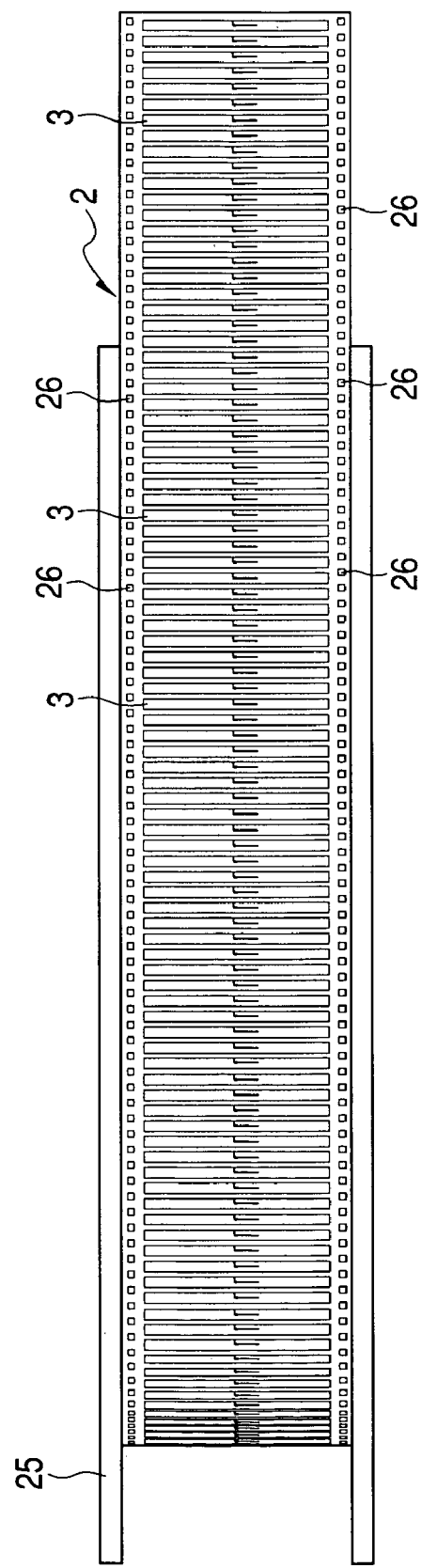
FIG. 12 is a plan view illustrating a portion of a long insulating film to be used for the manufacture of the inlet for an electronic tag according to the one embodiment of the present invention.
Figure 13:
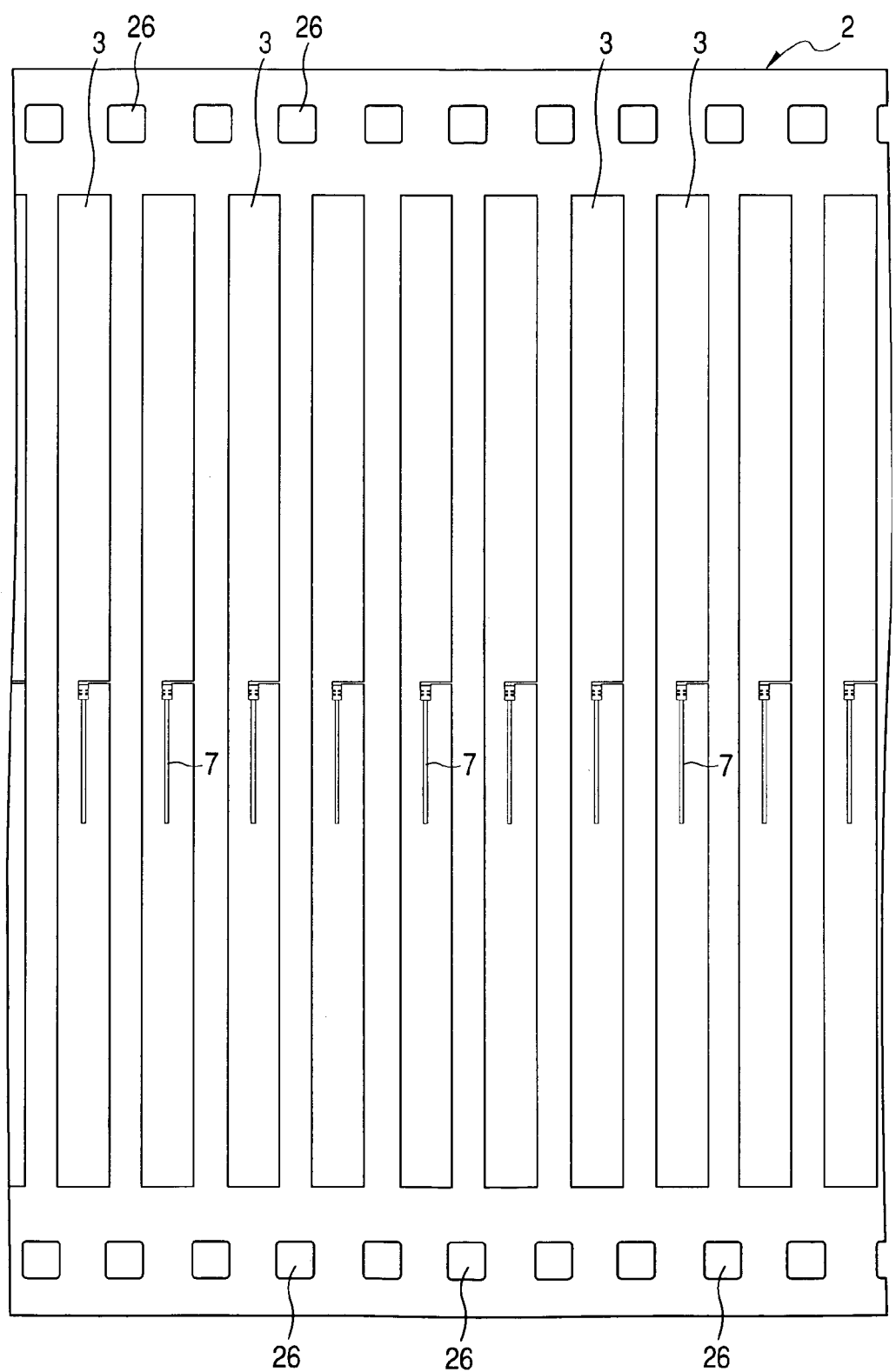
FIG. 13 is an enlarged plan view of a portion of the insulating film as illustrated in FIG. 12.

FIG. 12 is a plan view illustrating an insulating film 2 to be used for the manufacture of the inlet; and FIG. 13 is a plan view in which a portion of FIG. 12 is illustrated in an enlarged form.

As illustrated, the insulating film 2 is carried in the manufacturing step of the inlet 1 while being wound onto a reel 25. On one surface of this insulating film 2, a number of antennas 3 are formed in advance at regular intervals. These antennas 3 may each be formed, for example, by the following manner. A Cu foil of thickness of about 18 μm is adhered onto one surface of the insulating film 2, followed by etching the Cu foil into the shape of the antenna 3. At this time, a slit 7 and leads 10 as described above are formed in each of the antennas 3. The surface of each lead 10 is then subjected to Sn (tin) plating. In order to form a thinner insulating film and antenna, it is only necessary to form a first Cu film by sputtering on the surface of an insulating film of thickness of about 38 μm, forming a second Cu film thicker than the first Cu film by electroplating with the first Cu film as a seed layer and then patterning these first and second Cu films.

The insulating film 2 meets the standards of a film carrier tape. It is, for example, made of a polyimide resin film of 50 μm or 70 mm wide and 75 μm thick, and has, in one portion of the film, a device hole 8 as illustrated above in FIGS. 6 and 7. On both sides of the insulating film 2, sprocket holes 26 for carrying the insulating film 2 are formed at regular intervals. These device hole and sprocket holes 26 are each formed by punching out a portion of the insulating film 2.

Figure 14:
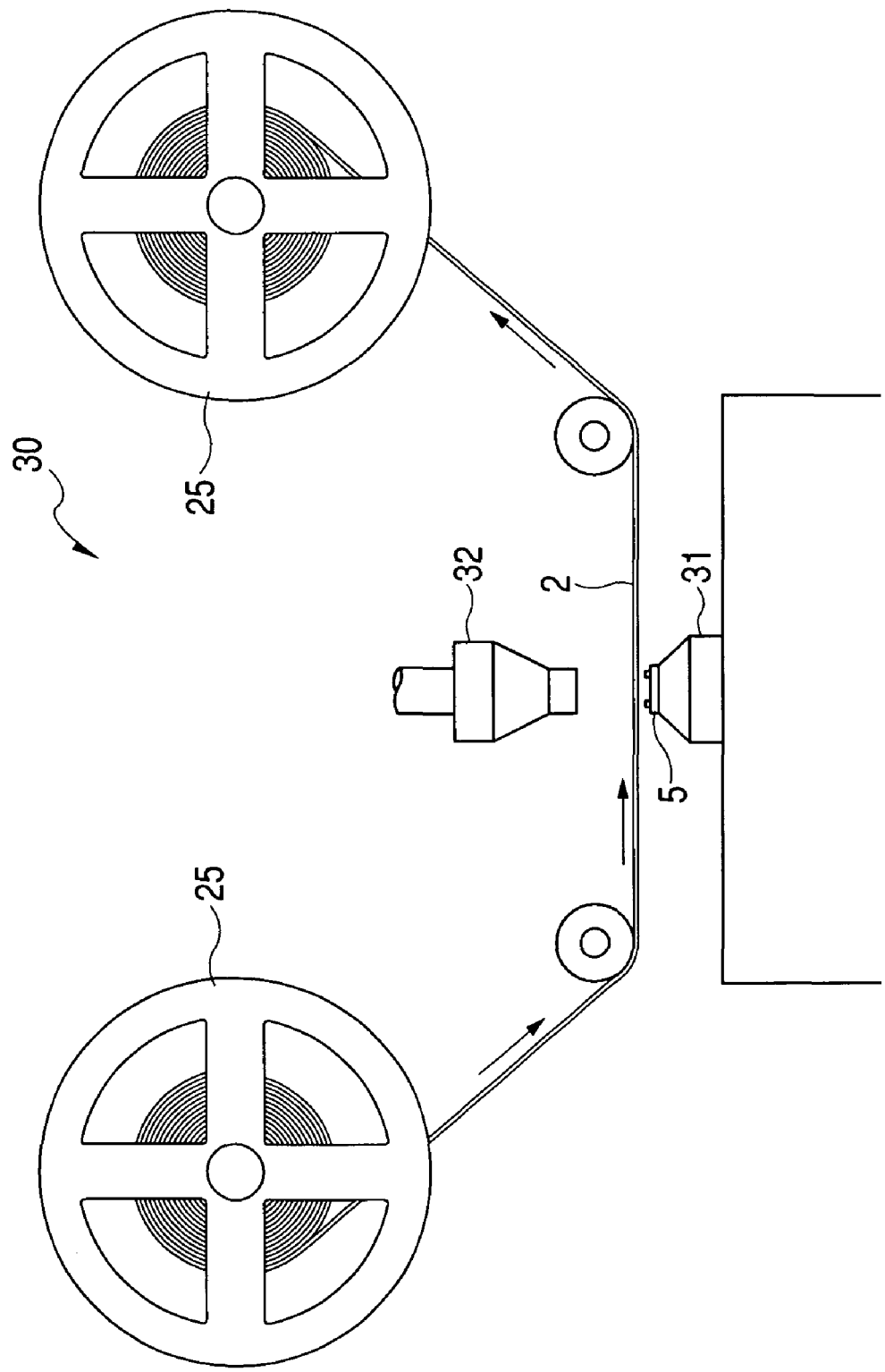
FIG. 14 is a schematic view of an inner lead bonder illustrating one (step for connecting the semiconductor chip to the antenna) of the manufacturing steps of the inlet for an electronic tag according to the one embodiment of the present invention.

As illustrated in FIG. 14, the reel 25 is attached to an inner lead bonder 30 equipped with a bonding stage 31 and a bonding tool 32 and while moving the insulating film 2 along the upper surface of the bonding stage 31, the semiconductor chip 5 is connected to the antenna 3.

Figure 15:
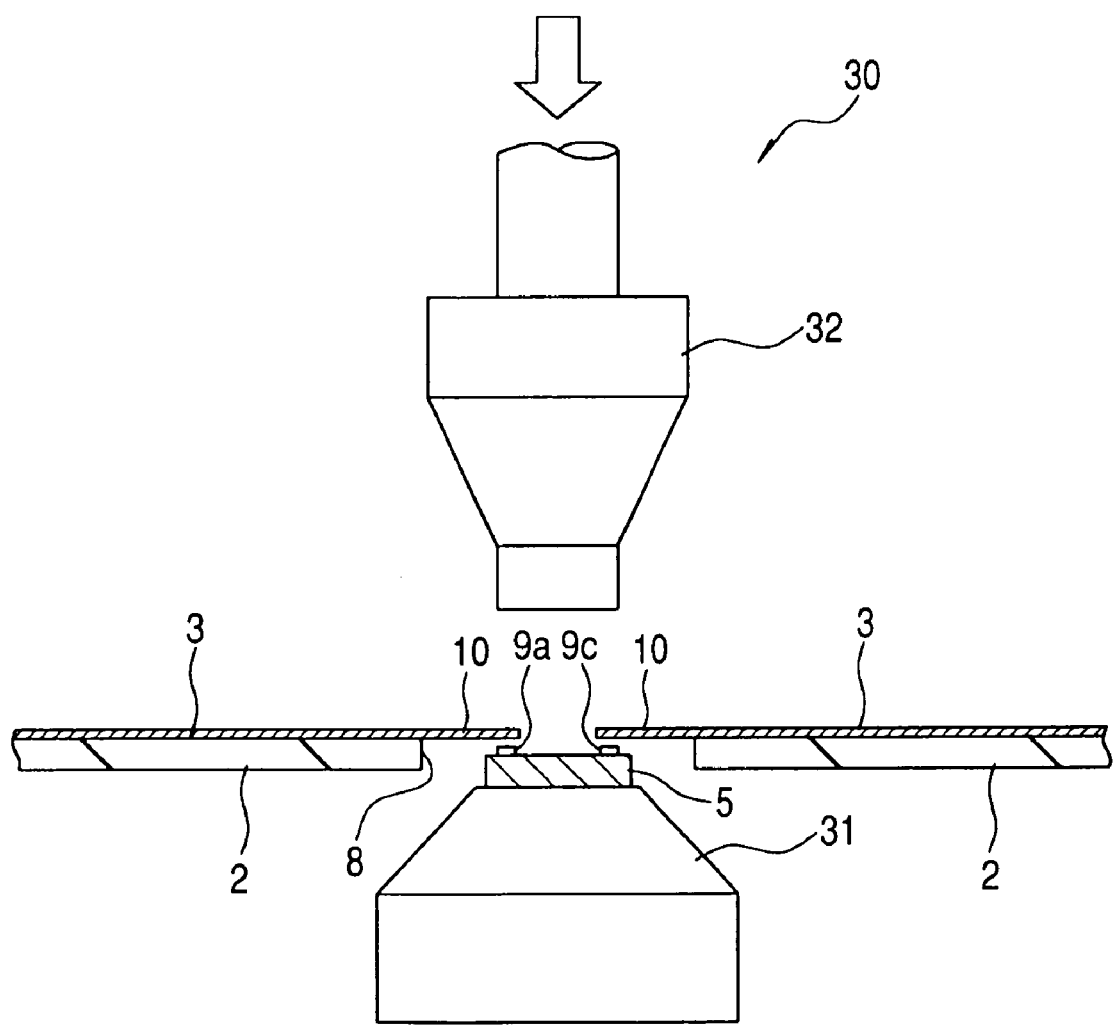
FIG. 15 is a fragmentary enlarged schematic view of the inner lead bonder as illustrated in FIG. 14.

The antenna 3 is connected to the semiconductor chip 5 by mounting, as illustrated in FIG. 15 (fragmentary enlarged view of FIG. 14), the semiconductor chip 5 on the bonding stage 31 heated to about 100° C., positioning the device hole 8 of the insulating film 2 directly above the semiconductor chip 5, and pressing the bonding tool 32 heated to about 400° C. against the upper surface of the leads 10 protruded inside of the device hole 8, thereby bringing the Au bumps (9a to 9d) in contact with the leads 10. At this time, a predetermined load is applied to the bonding tool 32 for about 2 seconds, whereby an Au—Sn eutectic alloy layer is formed at the interface between the Sn plating formed over the surface of the leads 10 and Au bumps (9a to 9d) and the Au bumps (9a to 9d) and leads 10 are adhered, respectively.

On the bonding stage 31, another semiconductor chip 5 is mounted. After the insulating film 2 is moved by one pitch of the antenna 3, this semiconductor chip 5 is connected to the antenna 3 in a similar procedure to that described above. The semiconductor chip 5 is then connected to all the antennas 3 formed in the insulating film 2 by repeating the above-described procedure. After completion of the connecting work of the semiconductor chips 5 and the antennas 3, the insulating film 2 is carried, to the subsequent resin sealing step, in the form wound onto the reel 25.

Figure 16:
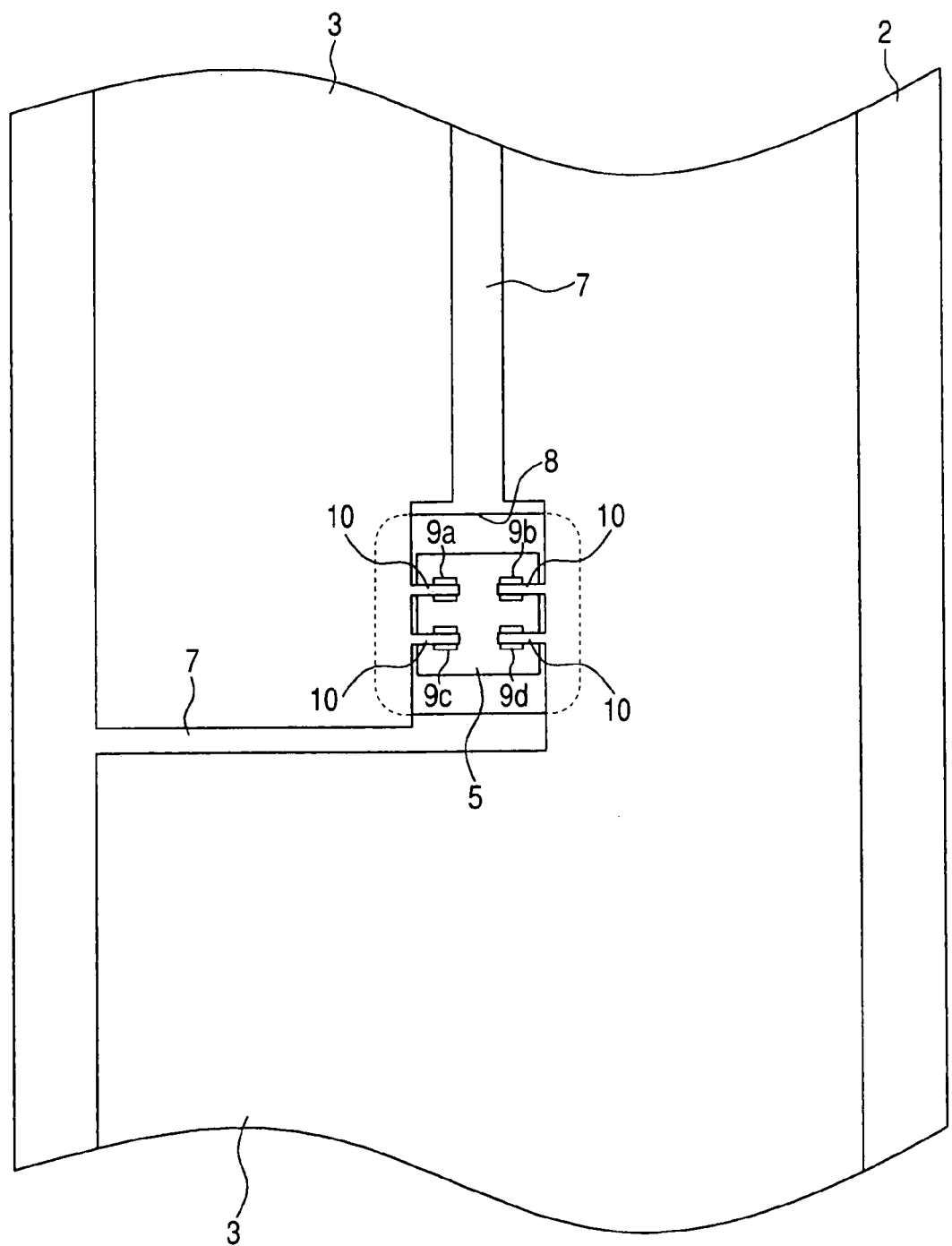
FIG. 16 is a fragmentary enlarged plan view of the insulating film illustrating one (step for connecting the semiconductor chip to the antenna) of the manufacturing steps of the inlet for an electronic tag according to the one embodiment of the present invention.
Figure 17:
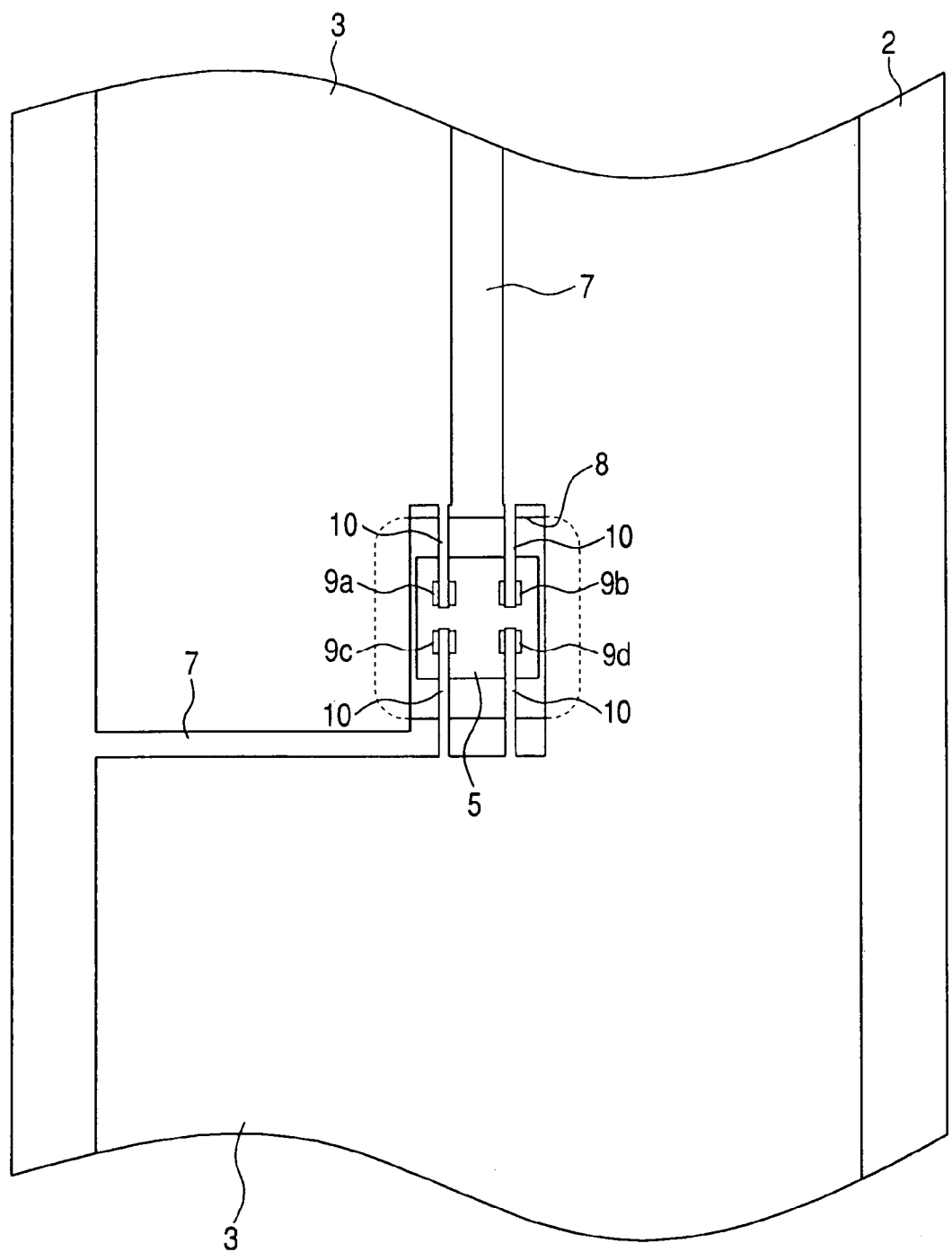
FIG. 17 is a fragmentary enlarged plan view of the insulating film illustrating one (step for connecting the semiconductor chip to the antenna) of the manufacturing steps of the inlet for an electronic tag according to the one embodiment of the present invention.

In order to improve connection reliability between the Au bumps (9a to 9d) and the corresponding leads 10, it is recommended to extend the four leads 10 in a direction perpendicular to the long side direction of the antenna 3 as illustrated in FIG. 16. When the four leads 10 are extended in parallel with the long side direction of the antenna 3 as illustrated in FIG. 17, a strong tensile stress acts on the joint between the Au bumps (9a to 9d) and the leads 10 by bending the completed inlet 1, presumably causing a deterioration in the connection reliability between them.

Figure 18:
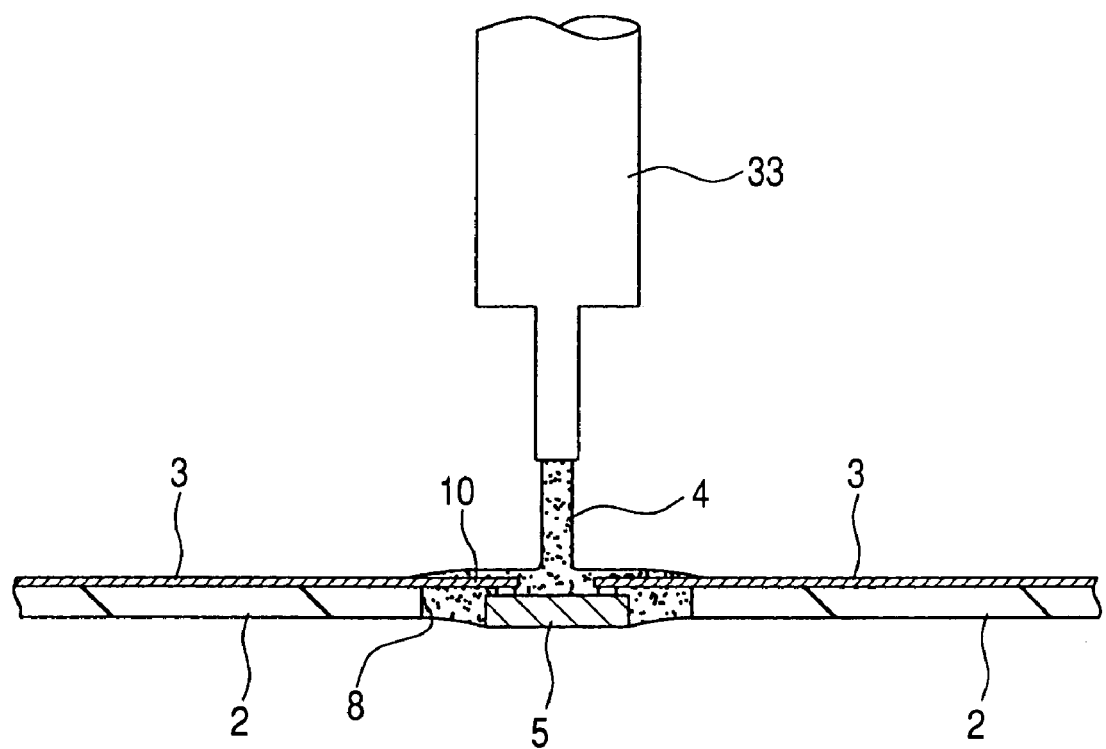
FIG. 18 is a schematic view illustrating one (a step for sealing the semiconductor chip with a resin) of the manufacturing steps of the inlet for an electronic tag according to the one embodiment of the present invention.
Figure 19:
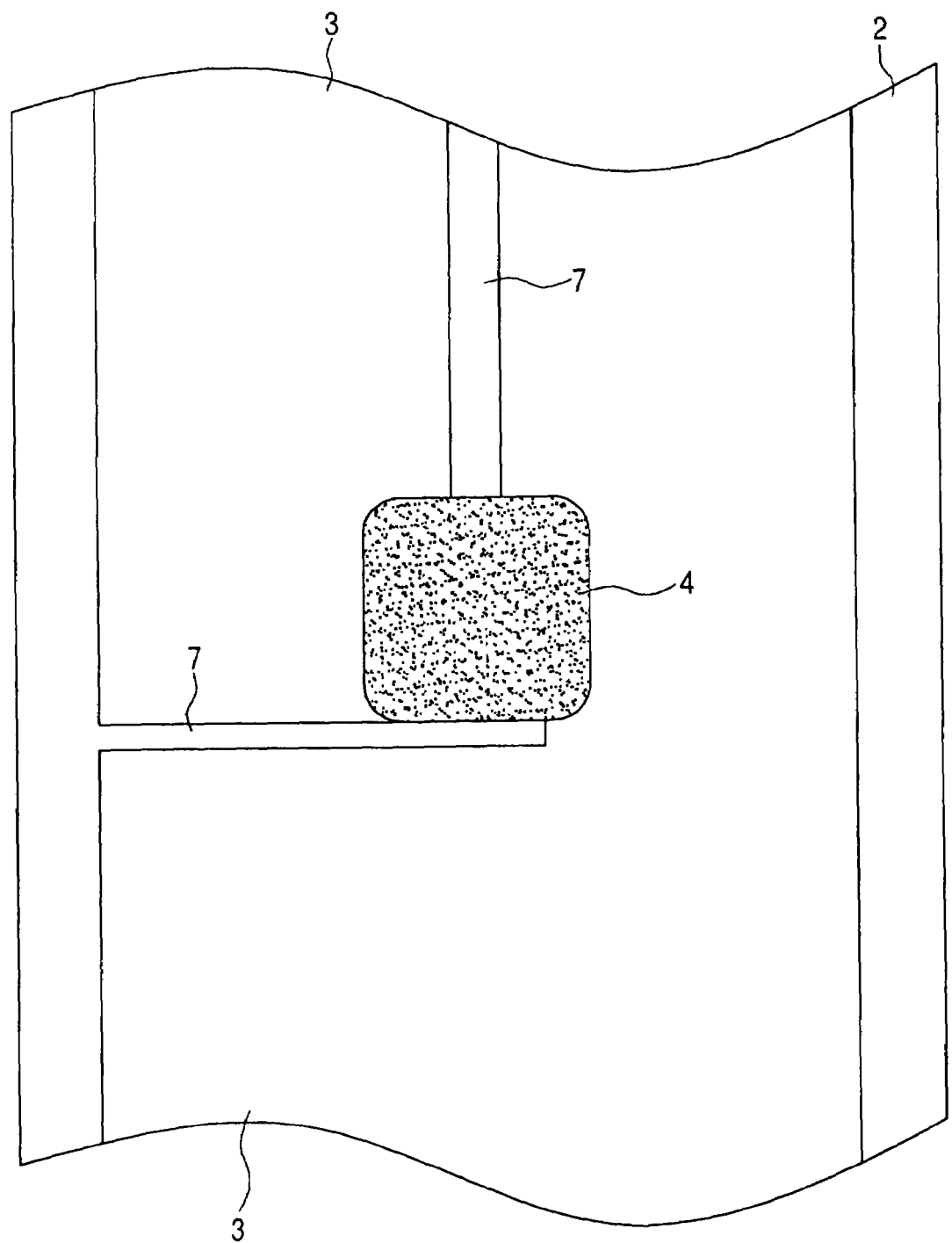
FIG. 19 is a fragmentary enlarged plan view of the insulating film illustrating one (step for sealing the semiconductor chip with a resin) of the manufacturing steps of the inlet for an electronic tag according to the one embodiment of the present invention.

In the resin sealing step of the semiconductor chip 5, as illustrated in FIGS. 18 and 19, a potting resin 4 is fed, by using a dispenser 33, to the upper and side surfaces of the semiconductor chip 5 mounted inside of the device hole 8, followed by baking the potting resin 4 in a heating furnace. Also in this resin sealing step, the potting resin 4 is fed and baked while moving the insulating film 2, which is however not illustrated. The insulating film 2 which has finished the resin sealing work is carried in the form wound onto the reel 25 to the subsequent inspection step, by which the connection state of the semiconductor chip 5 and antenna 3 and the appearance are inspected. Since a number of the antennas 3 formed in the insulating film 2 are electrically separated from each other, a continuity test between the respective antennas 3 and semiconductor chips 5 can be performed readily. Then, a cover film 6 (refer to FIG. 3) is stacked on the one surface of the insulating film 2 (on which the antenna 3 has been formed), whereby the manufacturing steps of the inlet 1 are completed.

Figure 20:
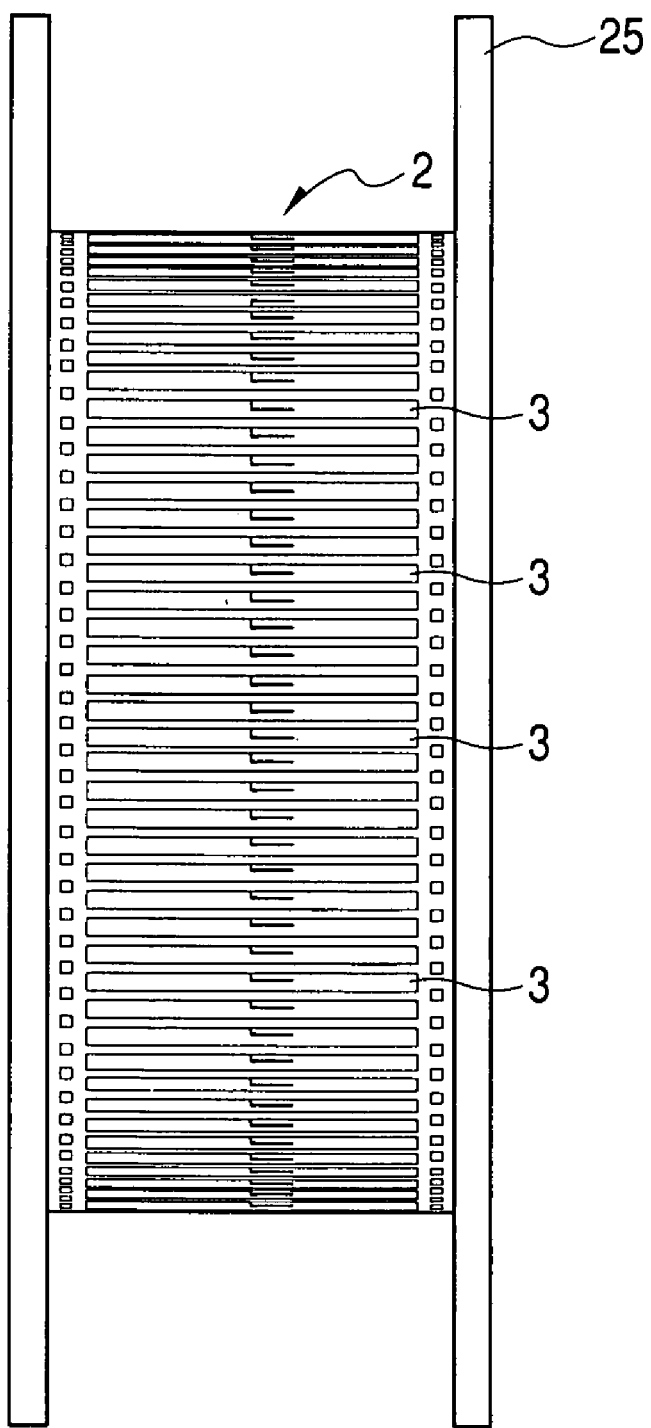
FIG. 20 is a side view illustrating the insulating film in the form wound onto a reel, which film is to be used for the manufacture of the inlet for an electronic tag according to the one embodiment of the present invention.

The inlet 1 thus manufactured is then packed in the form wound onto the reel 25 as illustrated in FIG. 20 and then shipped to customers.

Figure 21:
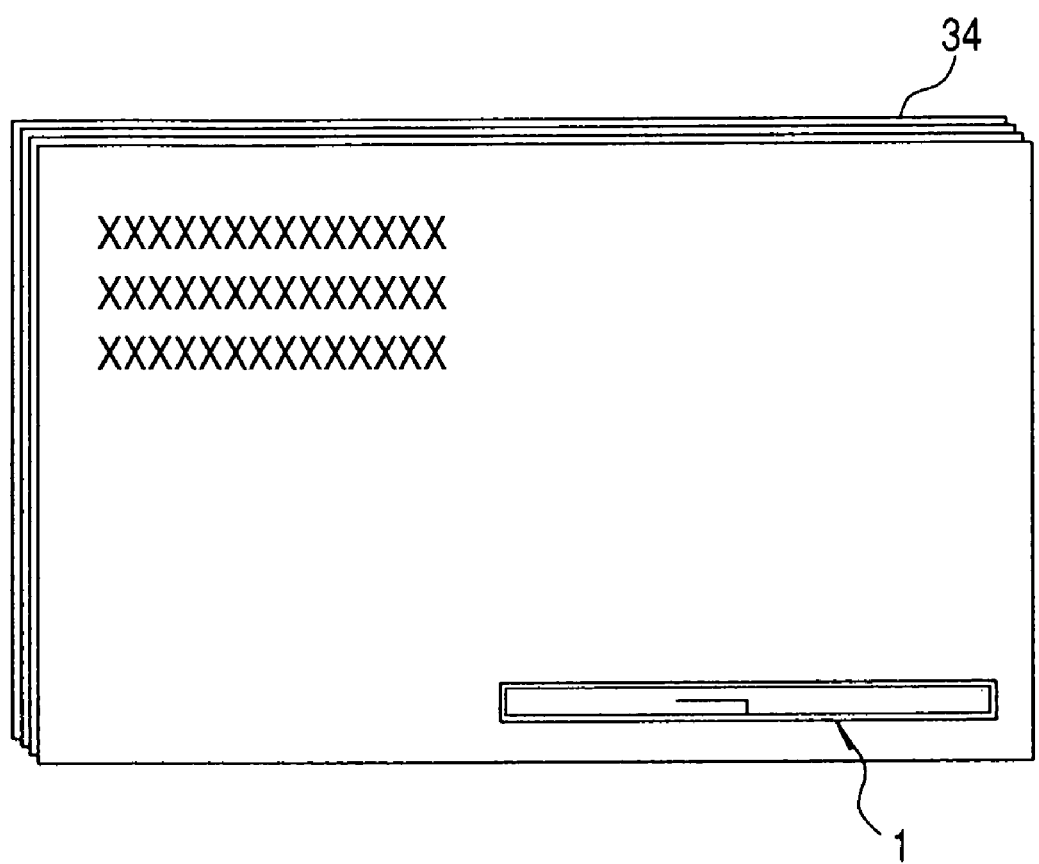
FIG. 21 is an explanatory view illustrating a using method of an electronic tag by using the inlet for an electronic tag according to the one embodiment of the present invention.

The customer who has purchased the reel of the inlet 1 then cuts the insulating film into each inlet 1 as shown in FIGS. 1 to 5. The resulting inlet 1 is combined with another member, whereby an electronic tag is manufactured. In FIG. 21, illustrated is an example of an electronic tag obtained by adhering a double-faced adhesive tape onto the back side of the inlet 1 and then, attached to the surface of a commodity such as expense sheet 34.

According to this embodiment, the antenna 3 is made of a thin Cu foil adhered to one surface of the flexible insulating film 2, so that it is possible to actualize the inlet 1 which is thin and rich in flexibility compared with an inlet having an antenna using Cu as a base material. In addition, the terminals (Au bumps 9a and 9b) of the semiconductor chip 5 are directly connected to the leads 10 formed integral with the antenna 3, respectively, so that compared with an inlet formed by connecting the antenna 3 and semiconductor chip 5 via a bonding wire, the inlet 1 of this embodiment can be made thinner by the thickness equivalent to the loop of the bonding wire. By the use of the insulating film 2 in which a number of antennas 3 have been formed at regular intervals, the manufacture of the inlet 1, more specifically, connection of the antenna 3 with the semiconductor chip 5, sealing of the semiconductor chip 5 with a resin, inspection and shipment, can be performed consistently.

The semiconductor chip 5 is disposed in the device hole 8 of the insulating film and the leads 10 and the terminals of the semiconductor chip 5 are connected inside of the device hole 8, which facilitates both the visual inspection at the connected part between the leads 10 and the terminals, and the protection of the connected part between the leads 10 and the terminals by filling with the potting resin 4.

Figure 22:
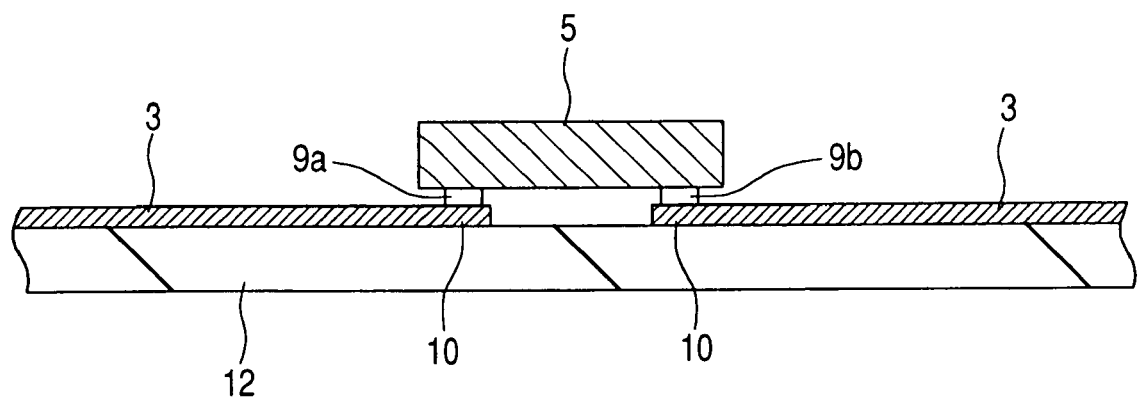
FIG. 22 is a fragmentary enlarged cross-sectional view of the insulating film illustrating a part (a step for connecting the semiconductor chip to the antenna) of the manufacturing steps of an inlet for an electronic tag according to another embodiment of the present invention.
Figure 23:
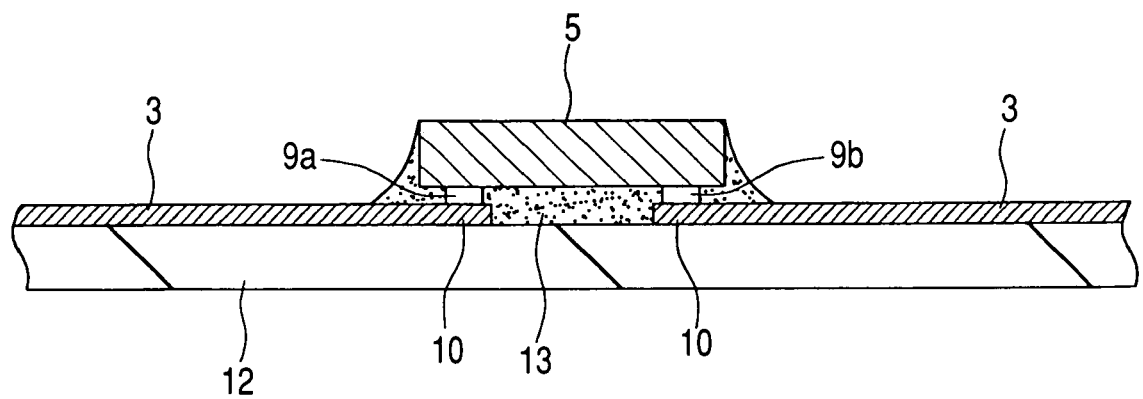
FIG. 23 is a fragmentary enlarged cross-sectional view of the insulating film illustrating one (a step for connecting the semiconductor chip to the antenna) of the manufacturing steps of the inlet for an electronic tag according to the another embodiment of the present invention.

In the above-described embodiment, the inlet 1 is manufactured using the insulating film 2 having the device hole 8 formed therein. For example, as illustrated in FIG. 22, it is also possible to form the antenna 3 integral with the leads 10 on one surface of the insulating film 12 free of the device hole 8 by the above-described method, followed by connection of the terminals (Au bumps 9a and 9b) of the semiconductor chip 5 to the leads 10. In this case, after the leads 10 are connected to the terminals (Au bumps 9a and 9b), an underfill resin 13 is filled in a space between the leads 10 and the terminals (Au bumps 9a and 9b) as illustrated in FIG. 23.

Use of the above-described insulating film 12 enables the failure-free connection between leads 10 and terminals (Au bumps 9a and 9b) compared with the use of the insulating film 2 having the device hole 8 formed therein, which makes it possible to improve the connection reliability between the leads and terminals and therefore, omit the dummy bumps (9c and 9d). When the insulating film 12 is used, however, the connected part between the leads 10 and the terminals (Au bumps 9a and 9b) cannot be observed visually from the back side of the insulating film 12, so that the visual inspection method needs some modification. In addition, a reliable filling technique is required for filling a markedly narrow space between the leads 10 and terminals (Au bumps 9a and 9b) with the underfill resin 13.

In the above-described embodiment, the antenna 3 is formed using a Cu foil adhered to the insulating film 2 made of a polyimide resin, but the cost of materials used for the inlet 1 can be reduced by constituting the antenna 3 from an Al (aluminum) foil adhered to one surface of the insulating film 2 or constituting the insulating film 2 from a resin (for example, polyethylene terephthalate) less expensive than the polyimide resin. When the antenna 3 is made of an Al foil, it is preferred to connect the Au bumps (9a to 9d) of the semiconductor chip 5 to the antenna 3 by forming an Au/Al bond using ultrasonic waves and heating in combination.

EMBODIMENT 2

In Embodiment 1, the inlet 1 was manufactured using the insulating film 2 in which the device hole 8 had been formed, while in this Embodiment, one example of a manufacturing process of a COF (Chip On Film) type inlet using an insulating film 12 free of a device hole as illustrated in FIG. 22 or 23 will be described.

Figure 24:
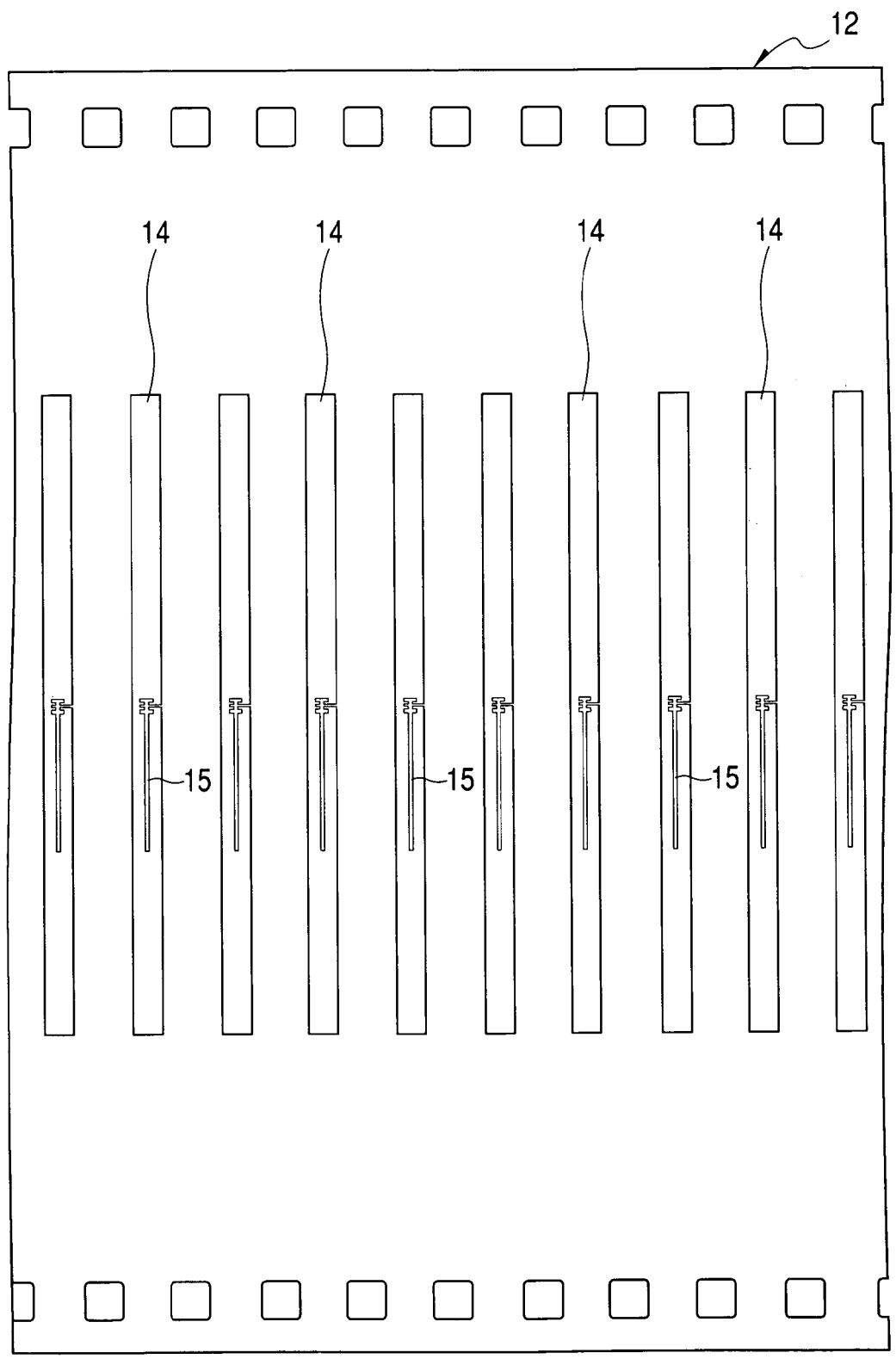
FIG. 24 is a plan view illustrating a portion of the long insulating film to be used for the manufacture of the inlet for an electronic tag according to the another embodiment of the present invention.

FIG. 24 is a plan view illustrating a portion of an insulating film 12 to be used for the manufacture of a COF type inlet. The insulating film 12 is made of a polyimide resin film as thin as about 38 μm and on one surface of the film, a number of antennas 14 having a slit 15 disposed therein are formed at regular intervals. The antennas 14 are each made of a metal film composed mainly of Cu.

The above-described antenna 14 is formed by forming a Cu film as thin as 0.1 μm or less on the surface of the insulting film 12 by sputtering, allowing a Cu film of thickness of about 9 μm to grow over the surface of the resulting Cu film by electroplating, patterning these Cu films into the shape of the antenna 14 by photolithography, and forming an Sn film of thickness of about 0.46 μm over the patterned films by electroless plating.

The insulating film 12 having the antenna 14 formed thereon by the above-described method is characterized by that compared with the insulating film 2 of Embodiment 1 to which a Cu foil was adhered to form the antenna therein, it is thin, is rich in flexibility, and has extremely high bending strength, because the Cu film constituting the antenna 14 is thin and the Cu film is formed over the surface of the insulating film 12 without using an adhesive.

Figure 25:
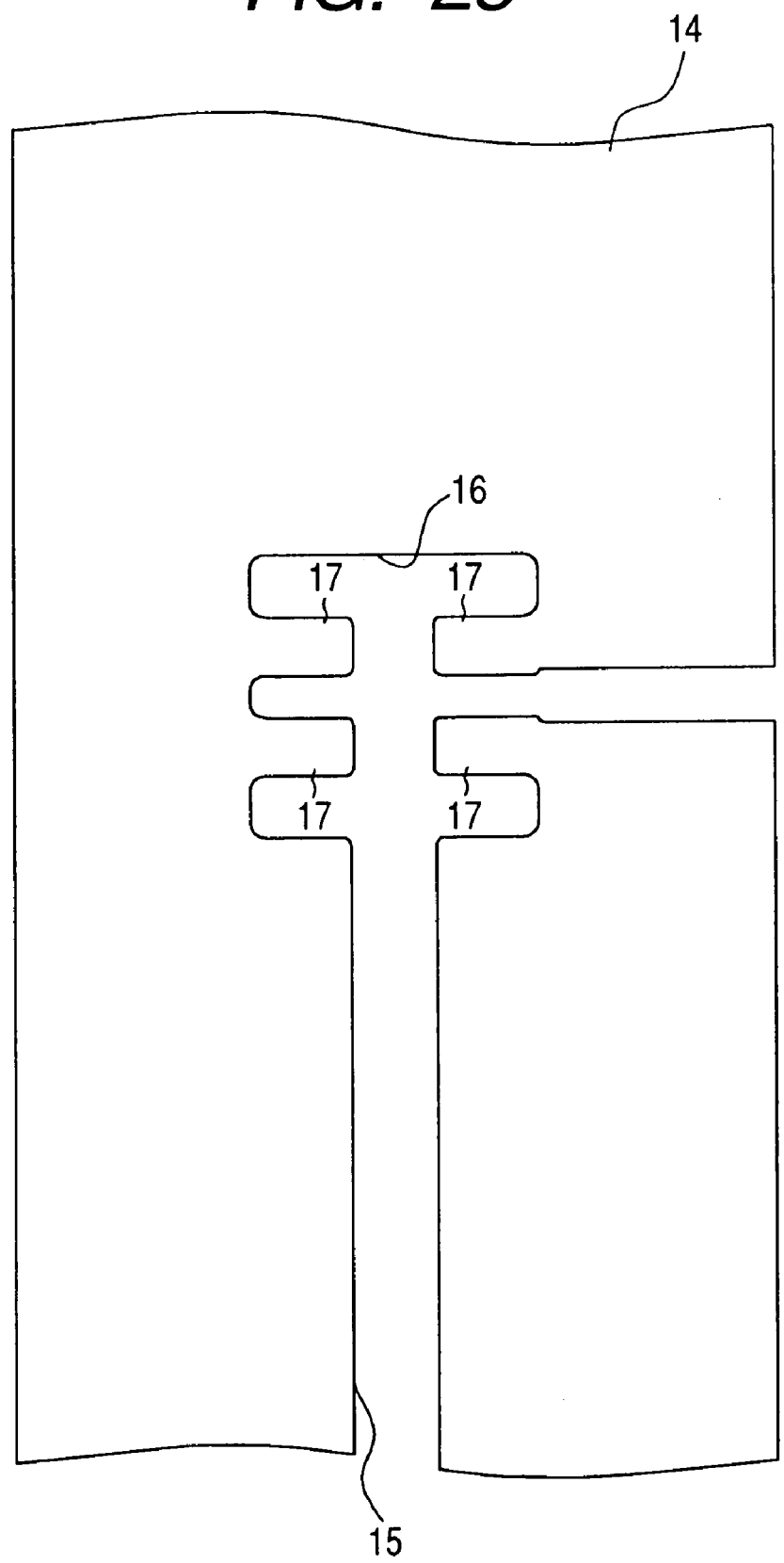
FIG. 25 is an enlarged plan view illustrating a portion of the antenna formed in the insulating film as illustrated in FIG. 24.

FIG. 25 is an enlarged plan view illustrating the vicinity of the center of the antenna 14. Almost at the center of the antenna 14, an L-shaped slit 15 having one end reaching the outer edge of the antenna 14 is disposed. At the corner of this slit 15, a rectangular cutout 16 formed by removing the Cu film constituting the antenna 14 to expose the insulating film 12 is disposed. Inside of this cutout 16, four lead patterns 17 integral with the antenna 14 and having an end extending in a direction of the corner portion of the slit 15 are formed. These four lead patterns 17 have the same area. The slit 15, cutout 16 and lead patterns 17 are formed simultaneously with the pattering of the Cu film into the shape of the antenna 14.

Figure 26:
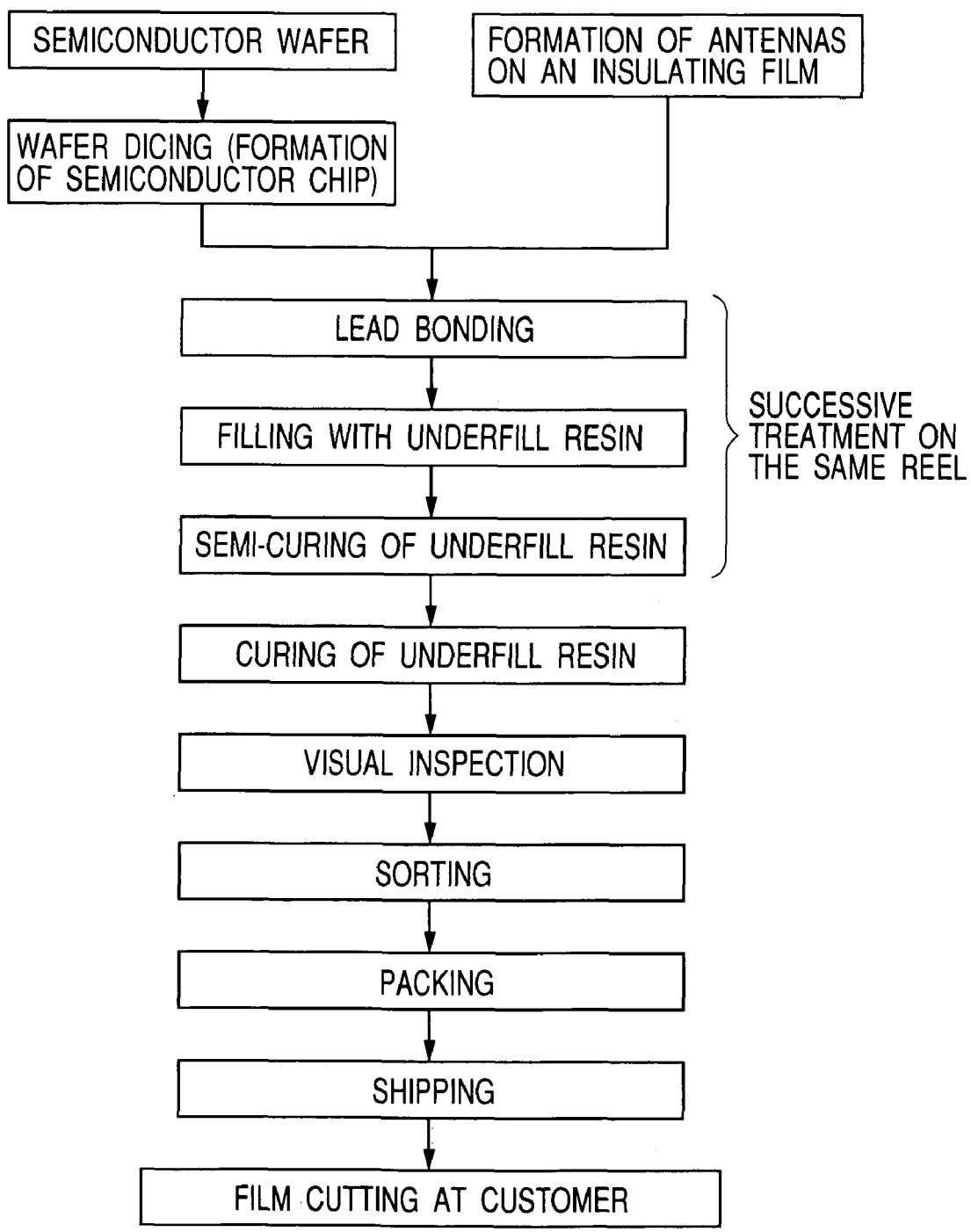
FIG. 26 is a flow chart illustrating the manufacturing steps of the inlet for an electronic tag according to the another embodiment of the present invention.

The COF type inlet using such an insulating film 12 will be manufactured in accordance with the flow illustrated in FIG. 26.

First, a semiconductor chip 5 obtained by dicing an Au bump wafer and an insulating film having an antenna 14 formed therein as described above are prepared. The semiconductor chip 5 is similar to that employed in Embodiment 1 (refer to FIGS. 8 to 11). The insulating film 12 is, similar to that in Embodiment 1, carried in a production line in the form wound onto a reel.

Figure 27:
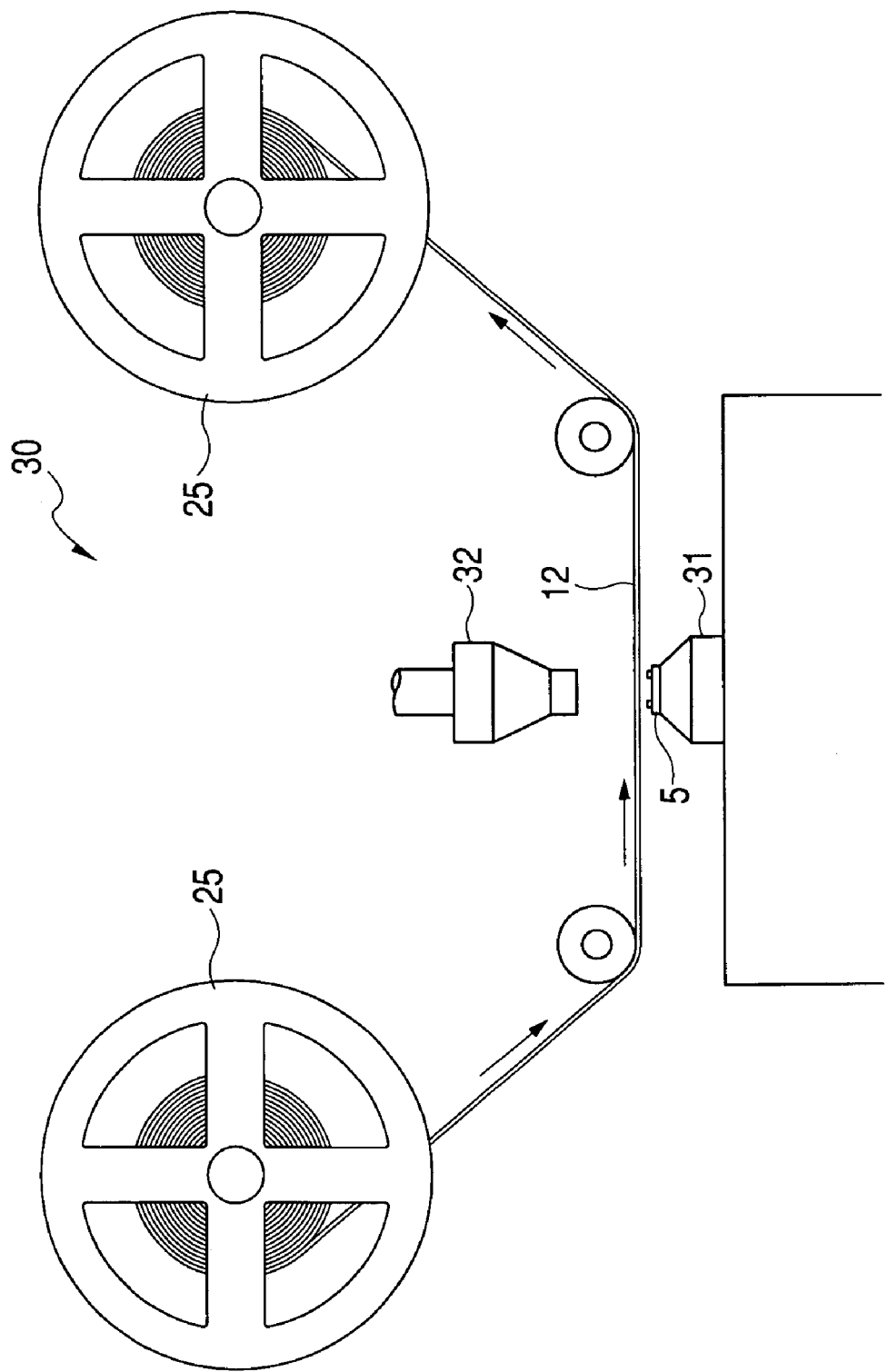
FIG. 27 is a schematic view of an inner lead bonder, illustrating one (a step for connecting the semiconductor chip to the antenna) of the manufacturing steps of the inlet for an electronic tag according to the another embodiment of the present invention.

As illustrated in FIG. 27, a reel 25 is attached to an inner lead bonder 30 equipped with a bonding stage 31 and a bonding tool 32 and connection (lead bonding) of the antenna 14 and the semiconductor chip 5 is performed while moving the insulating film 12 along the upper surface of the bonding stage 31.

Figure 28:
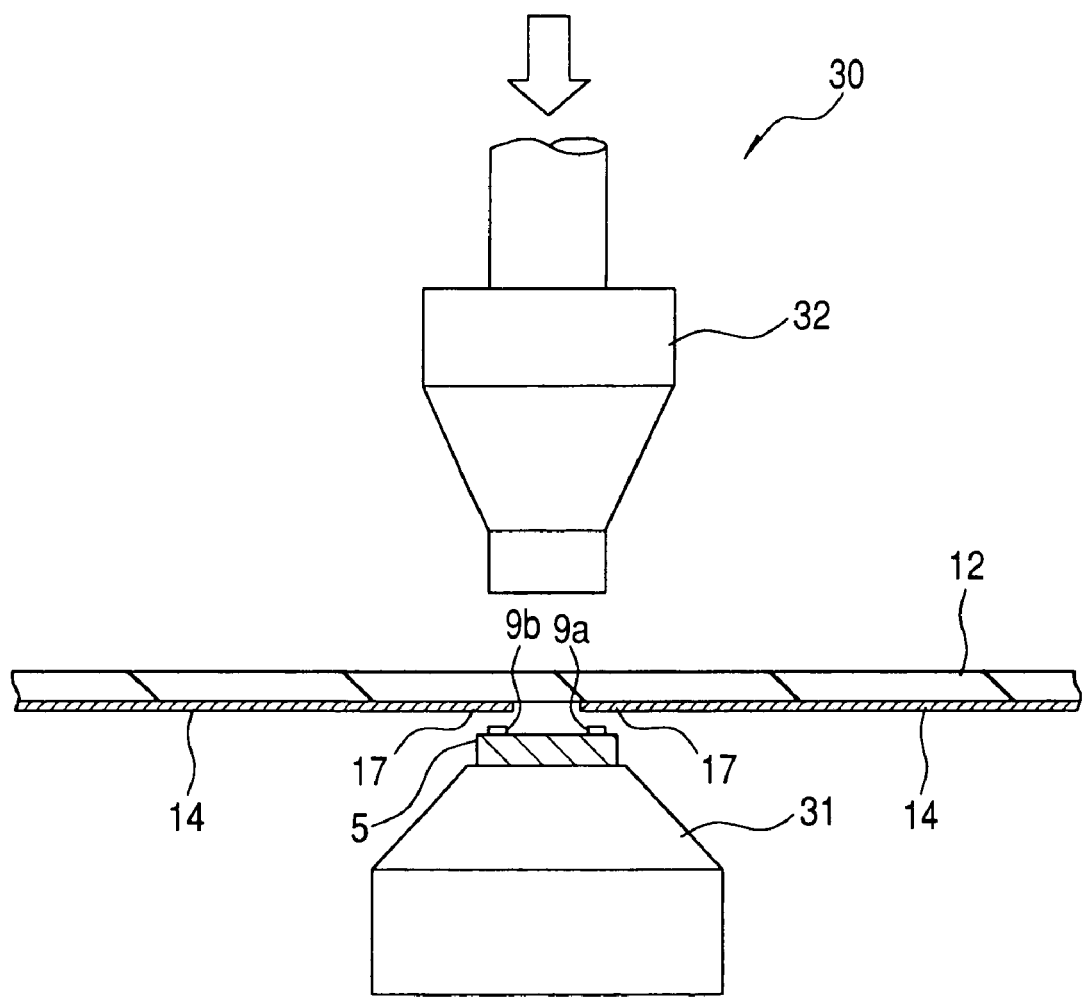
FIG. 28 is a fragmentary enlarged schematic view of the inner lead bonder as illustrated in FIG. 27.

Described specifically, as illustrated in FIG. 28, the semiconductor chip 5 is mounted on the bonding stage 31 heated to about 450° C. After positioning the lead patterns 17 of the antenna 14 directly above the semiconductor chip 5, the bonding tool 32 heated to about 100° C. is pressed against the upper surface of the insulating film 12 to bring the Au bumps (9a to 9d) into contact with the lead patterns 17. At this time, a predetermined load is applied to the bonding tool 32 for about 2 seconds, whereby an Au—Sn eutectic alloy layer is formed at the interface between the Sn plating formed over the surface of the lead patterns 17 and Au bumps (9a to 9d), and the Au bumps (9a to 9d) and lead patterns 17 are adhered, respectively.

Figure 29:
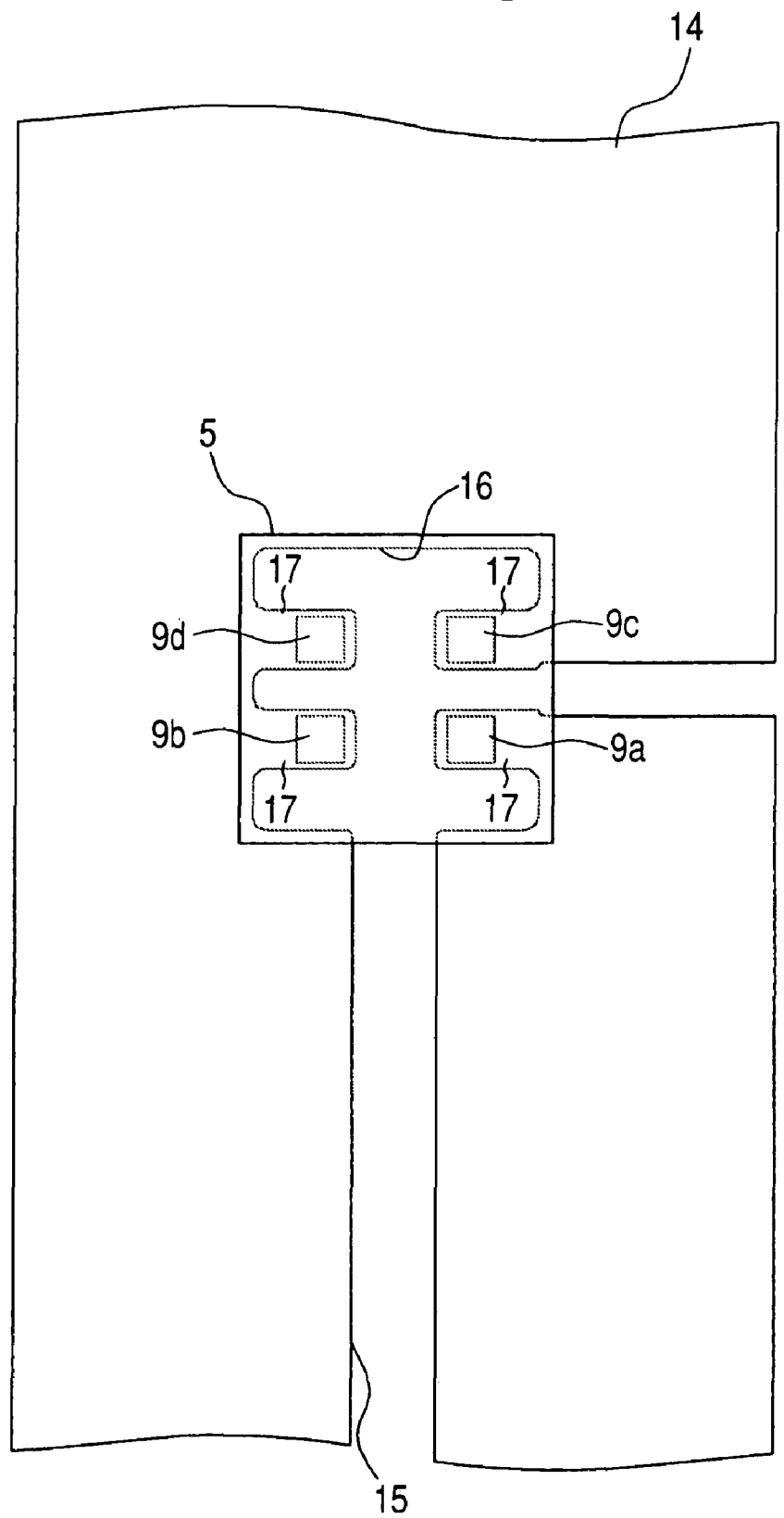
FIG. 29 is a plan view illustrating how the Au bumps and lead patterns of the semiconductor chip are overlapped each other.

FIG. 29 is a plain view illustrating how the Au bumps (9a to 9d) of the semiconductor chip 5 and lead patterns 17 are overlapped. In this embodiment, the cutout 16 is formed in a portion of the antenna 14 and four lead patterns 17 extending inside of this cutout 16 are connected with the Au bumps (9a to 9d), which is effective for heightening the connection reliability of the antenna 14 and the semiconductor chip 5 because of the reasons which will be described below.

Figure 30:
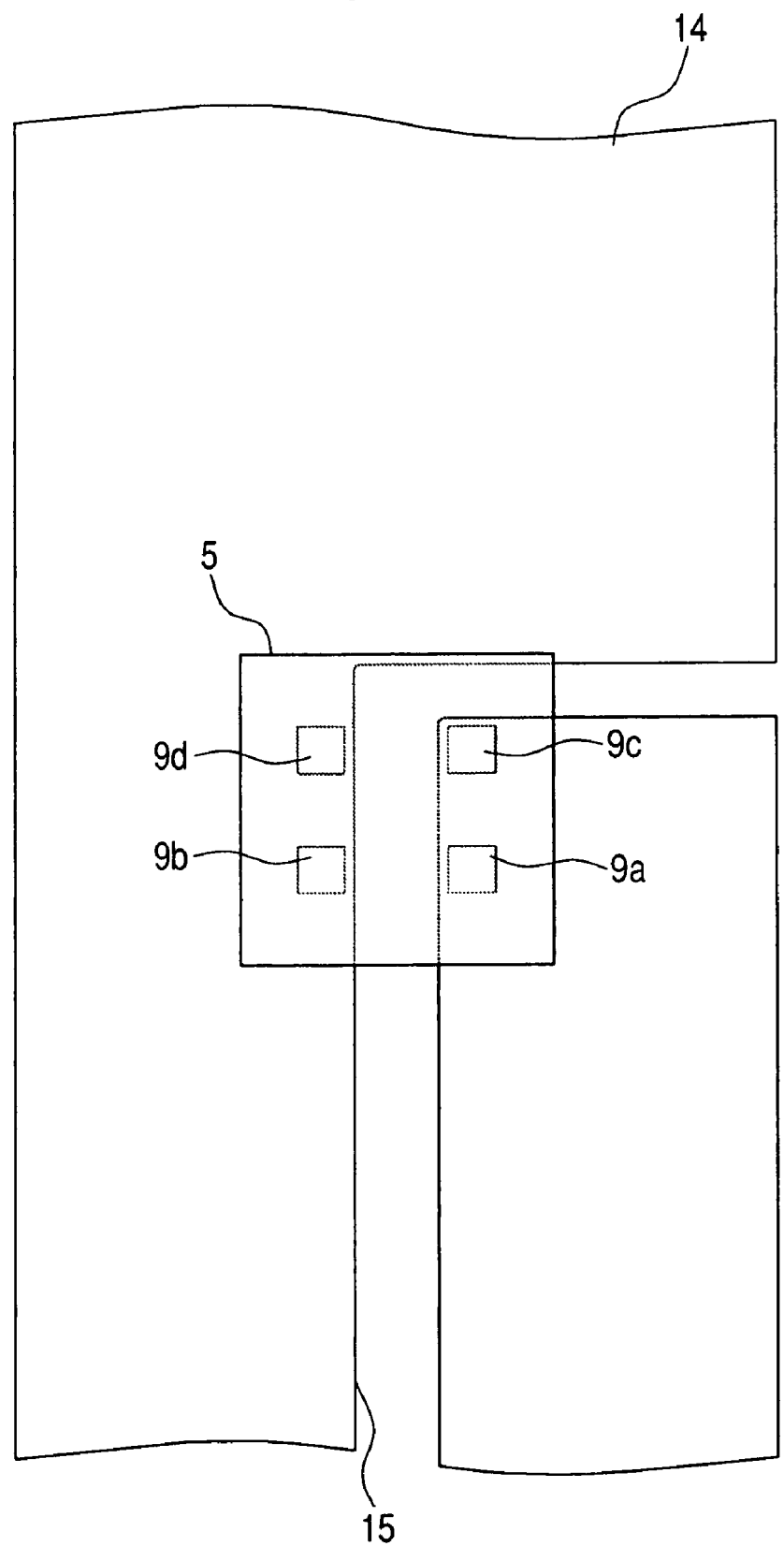
FIG. 30 is a plan view illustrating how the Au bumps and lead patterns are overlapped in Comparative Example.

When neither the cutout 16 nor lead pattern 17 is formed at the corner of the slit 15 of the antenna 14, the Au bumps (9a to 9d) of the semiconductor chip 5 are connected to the four sites of the antenna 14 existing on different sides of the slit 15. In such a case, however, the Cu film pattern formed around the Au bumps (9a to 9d) differs, depending on the position of the Au bumps (9a to 9d). This leads to a difference in the heat diffusion resistance (in the example illustrated in FIG. 30, a heat diffusion channel around the side to which the Au bumps 9a and 9c are connected is narrower than that around the side to which the Au bumps 9b and 9d are connected), so that upon bonding, a heat resistance in the heat diffusion channel becomes smaller and a heat diffusion amount therein becomes greater in the side having a wider heat diffusion channel (the side to which the Au bumps 9b and 9d are connected) than in the side having a narrower heat diffusion channel (the side to which the Au bumps 9a and 9c are connected).

Figure 31:
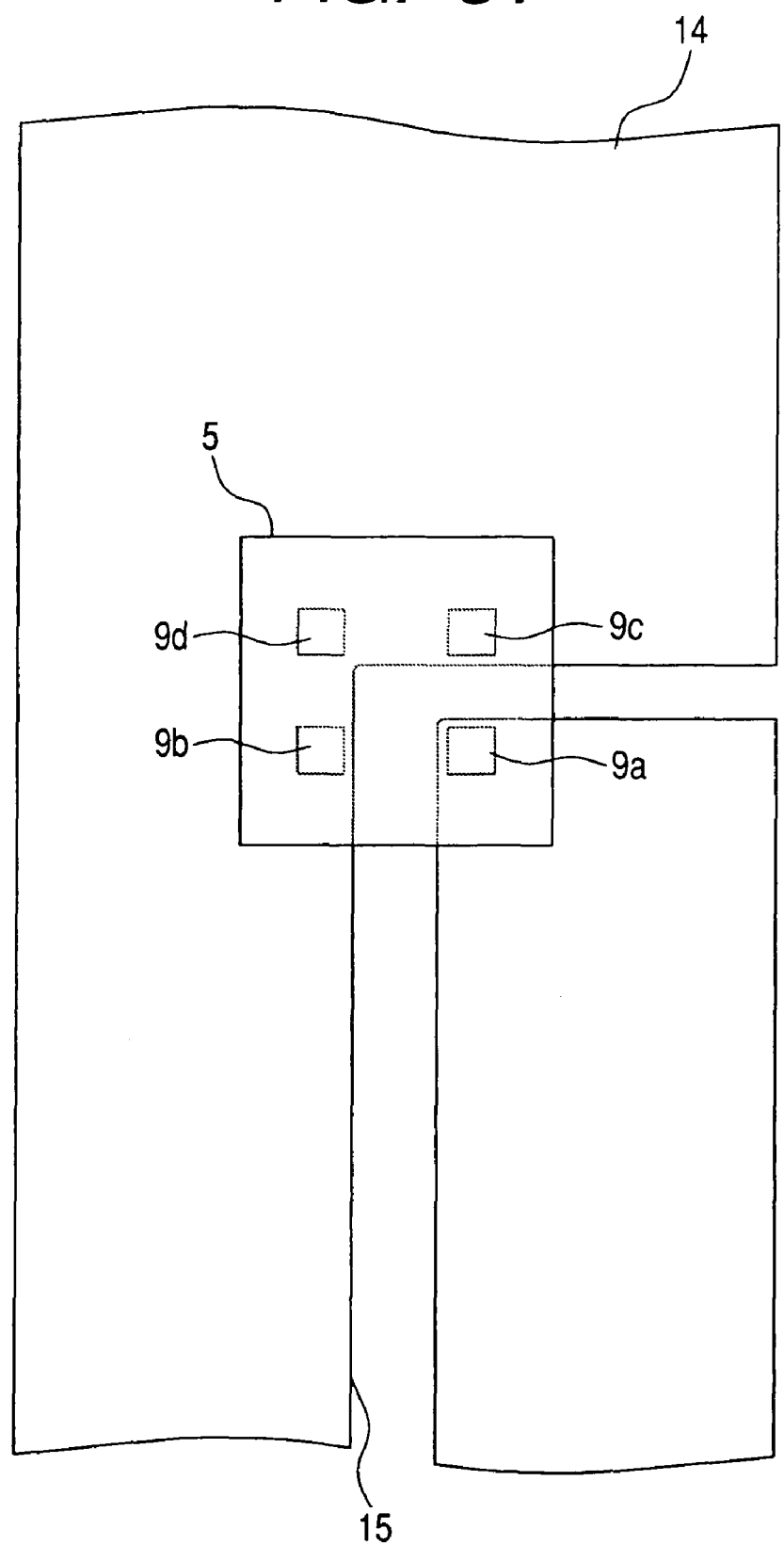
FIG. 31 is a plan view illustrating how the Au bumps and lead patterns are overlapped in another Comparative Example.

As a result, the surface temperature of the antenna 14 lowers on the side having a wider heat diffusion channel, which prevents sufficient formation of an Au—Sn eutectic alloy layer at the interface between the Au bumps (9b and 9d) and antenna 14, leading to a deterioration in the adhesive force therebetween. When the antenna 14 and Au bumps (9a to 9d) are connected, for example, at positions as illustrated in FIG. 31, adhesive force with the antenna 14 becomes lower at the three Au bumps (9b, 9c and 9d) which are brought into contact with the antenna 14 on the side having a wider heat diffusion channel than at the one Au bump 9a brought into contact with the antenna 14 on the side having a narrower heat diffusion channel.

If the temperature of the bonding stage 3 or bonding tool 32 is heightened in anticipation of a lowering in the surface temperature of the antenna 14 on the side having a wider heat diffusion channel, the insulating film 12 having no device hole 8 different from the insulating film 2 employed in Embodiment 1 is exposed, at the chip mounting region of the film 12, to high temperatures and undergoes thermal deformation. The product thus obtained inevitably becomes defective.

On the other hand, when the cutout 16 and lead patterns 17 are formed as described above in the chip mounting region of the antenna 14 and these lead patterns 17 are connected with the Au bumps (9a to 9d), a heat diffusion channel from the lead patterns 17 is narrowed by the cutout so that upon bonding, a heat diffusion amount from the lead patterns 17 towards the antenna 14 decreases. In addition, since heat diffusion channels from lead patterns are almost uniformly narrowed by the cutout, the temperature is almost equal at the respective joints between the four Au bumps (9a to 9d) and lead patterns 17.

The smaller the area of the lead pattern 17, the less the heat diffusion amount from the lead pattern 17 to the antenna 14. Excessively small diffusion amounts reduce a contact area with the Au bumps (9a to 9d), leading to a reduction in the bonding strength between the Au bumps and the antenna. In order to suppress the heat diffusion amount and keep a certain contact area, the width of the lead pattern 17 may be set at a size slightly greater than the diameter of the Au bumps (9a to 9d) (the size meaning the diameter of the Au bump+alignment margin).

By forming the cutout 16 and lead patterns 17 in the chip mounting region of the antenna 14 and connecting the lead patterns 17 and Au bumps (9a to 9d), it is possible to suppress a temperature decrease at the joints between the Au bumps (9a to 9d) and lead patterns 17 upon bonding and at the same time, to make the temperatures uniform at the joints between the four Au bumps (9a to 9d) and the lead patterns 17. This makes it possible to form a uniform Au—Sn eutectic alloy layer at the interface between the Au bumps (9a to 9d) and lead patterns 17 and heighten the bonding strength therebetween, leading to an improvement in the connection reliability between the antenna 14 and the semiconductor chip 15.

The shape of the cutout 16 or lead patterns 17 disposed in the chip mounting region of the antenna 14 is not limited to the above-described hoe type or stag type, but any shape can be adopted insofar as it prevents a temperature decrease at the position to be brought into contact with the four Au bumps (9a to 9d) and at the same time it actualizes temperature uniformity.

Figure 32:
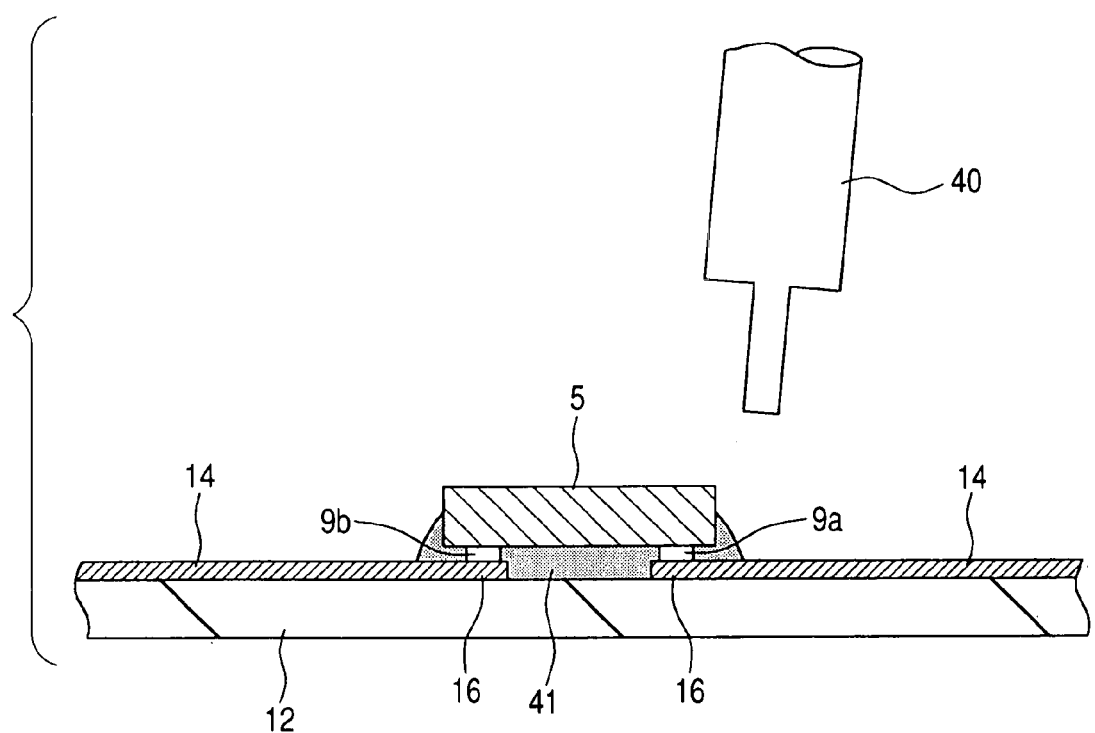
FIG. 32 is a schematic view illustrating one (a step for sealing the semiconductor chip with a resin) of the manufacturing steps of the inlet for an electronic tag according to the another embodiment of the present invention.

An underfill resin 41 is then filled by using a dispenser 40 in a space between the lower surface of the semiconductor chip 5 and the insulating film 12 (and antenna 14) as illustrated in FIG. 32, followed by curing of the underfill resin 41 in a heating furnace. This curing of the underfill resin 41 in a heating furnace is performed first by semi-curing the underfill resin 41, winding the insulating film 12 onto a reel 25, carrying the reel 25 in the heating furnace to completely cure the underfill resin 41. Prior to winding of the insulating film 12 onto the reel 25 after semi-curing of the underfill resin 41, inspection to judge whether the connection between the antenna 14 and semiconductor chip 5 is good or not may be carried out.

Figure 33:
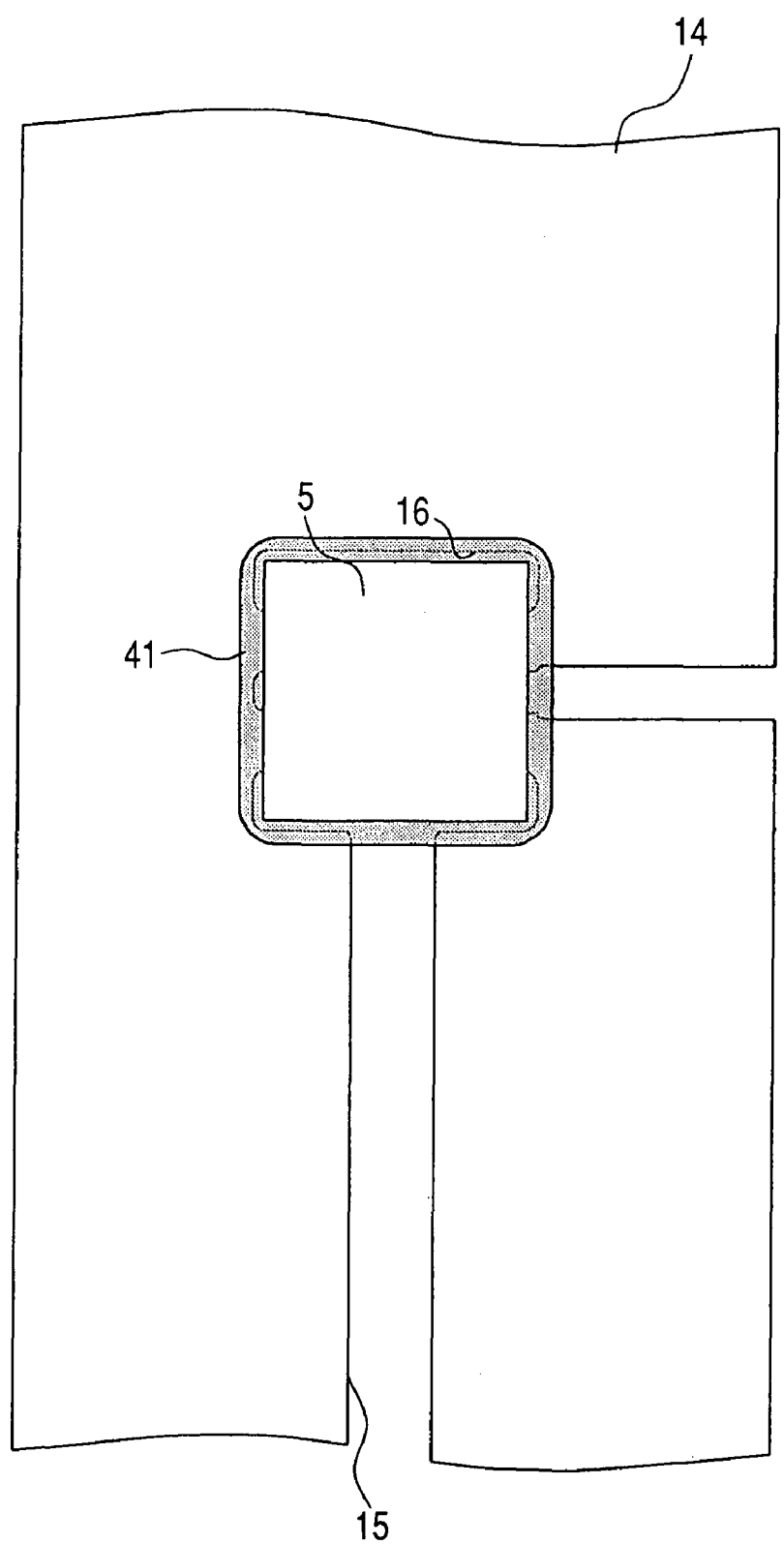
FIG. 33 is a plan view illustrating one example of a relation between the size of the cutout formed in one portion of the antenna and the size of the resin for sealing the semiconductor chip.
Figure 34:
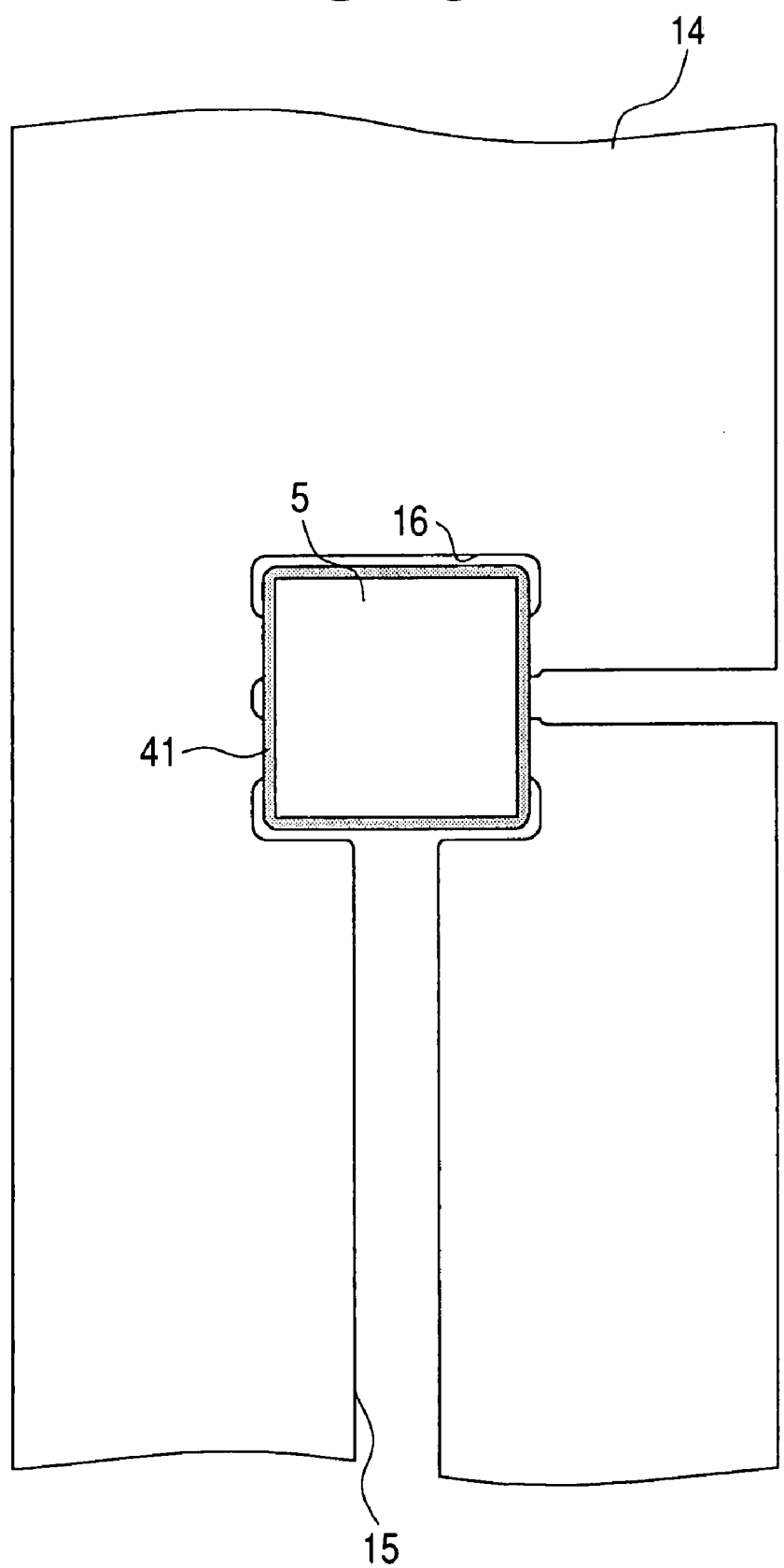
FIG. 34 is a plan view illustrating another example of a relation between the size of the cutout formed in one portion of the antenna and the size of the resin for sealing the semiconductor chip.
Figure 35:
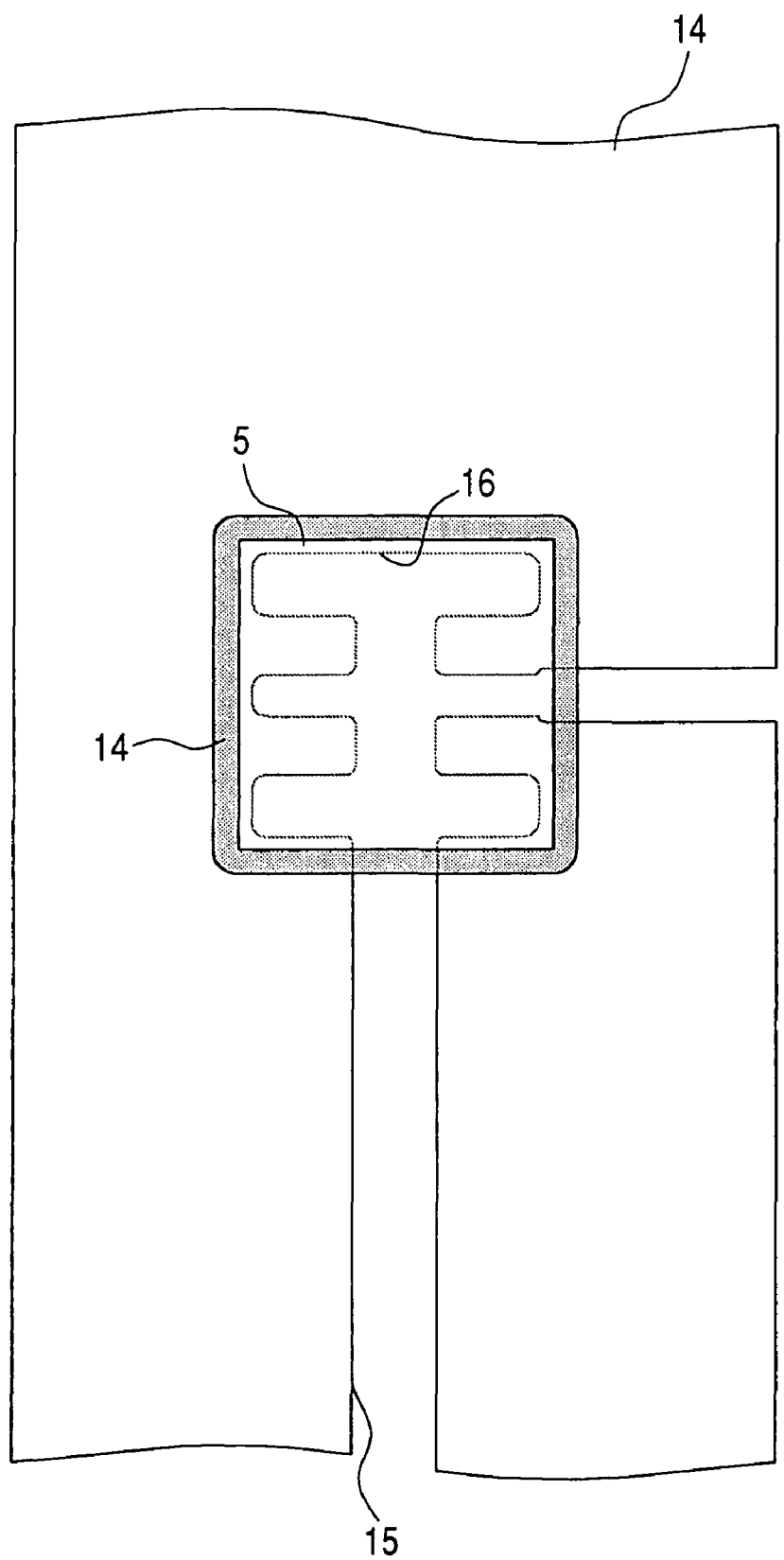
FIG. 35 is a plan view illustrating one example of a relation among the size of the cutout formed in one portion of the antenna, the size of the semiconductor chip, and the size of the resin for sealing the semiconductor chip.

As illustrated in FIG. 33, the underfill resin 41 filled in the lower surface of the semiconductor chip 5 is, at the outermost edge of the resin, preferably brought into contact with the antenna 14 outside of the cutout 16. In short, the diameter of the underfill resin 41 is desirably greater than that of the cutout 16. On the other hand, when the diameter of the underfill resin 41 is smaller than that of the cutout 16 as illustrated in FIG. 34, the insulating film 12 covered with neither the antenna 14 nor the underfill resin 41 is exposed partially inside of the cutout 16.

Since the insulating film 12 is considerably thin, a stress is applied to a thin portion of the completed inlet, if any, upon bending of the inlet, which presumably causes peeling of the semiconductor chip 5 from the antenna 14. The insulating film 12 inside of the cutout 16 is therefore desirably covered with the underfill resin 41 as illustrated in FIG. 32. At this time, when the diameter of the cutout 16 is made smaller than that of the semiconductor chip 5, the insulating film 12 inside of the cutout 16 is covered with the underfill resin 41 and the semiconductor chip 5, leading to a further improvement in the film strength in the vicinity of the joint between the semiconductor chip 5 and antenna 14.

Upon formation of the cutout 16 and lead patterns 17 in the antenna 14, their shape or size is preferably designed in consideration of the size of the underfill resin 41 or semiconductor chip 5.

The underfill resin 41 is made of an organic resin such as epoxy so that it is recommended to form an organic resin film such as polyimide resin film on the uppermost surface of the semiconductor chip 5. This reinforces the adhesive force between the underfill resin 41 and the semiconductor chip 5, leading to an improvement in the bending strength (connection strength between the semiconductor chip 5 and antenna 14) of the completed inlet.

With the completion of the resin sealing of the semiconductor chip 5, the manufacturing step of the inlet is almost finished. After visual inspection step and final sorting step, the COF type inlet thus manufactured is packed in the form wound onto a reel, and shipped to customers, where the inlet is cut and separated from the insulating film 12.

This Embodiment thus enables manufacture of a COF type inlet which is thin, has a small size, and has considerably high bending strength. It is therefore possible to provide an inlet which can withstand the use even under poor conditions exposed to heat, moisture or mechanical stress.

The present invention made by the present inventors was described specifically based on some embodiments. It should however be borne in mind that the present invention is not limited to or by them, but can be modified within an extent not departing from the gist of the invention.

Advantages available by the typical inventions, among the inventions disclosed by the present application, will next be described briefly.

According to one embodiment of the present invention, an inlet for an electronic tag which is thin and has high bending strength can be actualized at a low cost.

What is claimed is:

1. An inlet for an electronic tag comprising:
   an insulating film;
   an antenna made of a conductor layer formed over one surface of the insulating film;
   a slit formed in a portion of the antenna and having one end extending toward the outer edge of the antenna;
   a semiconductor chip electrically connected to the antenna via a plurality of bump electrodes at a predetermined lengthwise portion of the slit; and
   a resin sealing the semiconductor chip and the plurality of bump electrodes;
   wherein the plurality of bump electrodes are electrically connected to a plurality of leads integral with the antenna, respectively; and
   wherein each of the plurality of leads extends in a direction perpendicular to a long side direction of the antenna.

2. An inlet for an electronic tag according to claim 1, wherein the conductor layer is formed by patterning a copper foil or an aluminum toil formed over the one surface of the insulating film.

3. An inlet for an electronic tag according to claim 1, wherein the semiconductor chip is disposed inside of a device hole formed in the insulating film.

4. An inlet for an electronic tag according to claim 1, wherein the plurality of bump electrodes electrically connecting the antenna with the semiconductor chip include a dummy bump not electrically connected to a circuit in the semiconductor chip.

5. An inlet for an electronic tag according to claim 4, wherein the plurality of bump electrodes has one bump electrode constituting an input terminal of the circuit, another bump electrode constituting a GND terminal of the circuit, and two dummy bump electrodes not electrically connected to the circuit.

6. An inlet for an electronic tag according to claim 5, wherein the bump electrode constituting the input terminal of the circuit is electrically connected to one half of the antenna obtained by dividing the antenna into two by the slit and the bump electrode constituting the GND terminal of the circuit is electrically connected to the other half of the antenna.

7. An inlet for an electronic tag according to claim 1, wherein a cover film for protecting the antenna and the semiconductor chip is stacked over the one surface of the insulating film.

8. An inlet for an electronic tag comprising:
an insulating film;
an antenna made of a conductor layer formed over one surface of the insulating film;
a slit formed in a portion of the antenna;
a semiconductor chip electrically connected to the antenna via a plurality of bump electrodes at a predetermined lengthwise portion of the slit; and
a resin sealing the semiconductor chip and the plurality of bump electrodes;
wherein the slit has a first portion extending from the toward a lateral edge of the antenna, and a second portion extending transversely to the first portion; and
wherein the first portion of the slit is shorter than the second portion of the slit.

9. An inlet for an electronic tag according to claim 8, wherein the conductor layer is formed by patterning a copper foil or an aluminum foil formed over the one surface of the insulating film.

10. An inlet for an electronic tag according to claim 8, wherein the semiconductor chip is disposed inside of a device hole formed in the insulating film.

11. An inlet for an electronic tag according to claim 8, wherein the plurality of bump electrodes electrically connecting the antenna with the semiconductor chip include a dummy bump not electrically connected to a circuit in the semiconductor chip.

12. An inlet for an electronic tag according to claim 11, wherein the plurality of bump electrodes has one bump electrode constituting an input terminal of the circuit, another bump electrode constituting a OND terminal of the circuit, and two dummy bump electrodes not electrically connected to the circuit.

13. An inlet for an electronic tag according to claim 12, wherein the bump electrode constituting the input terminal of the circuit is electrically connected to one portion of the antenna obtained by dividing the antenna into two portions by the slit, and the bump electrode constituting the GND terminal of the circuit is electrically connected to the other portion of the antenna.

14. An inlet for an electronic tag according to claim 8, wherein the plurality of bump electrodes are electrically connected to a plurality of leads which forms integral with the antenna, respectively; and wherein each of the plurality of leads extends in a direction perpendicular to a long side direction of the antenna.

15. An inlet for an electronic tag according to claim 8, wherein a cover film for protecting the antenna and the semiconductor chip is stacked over the one surface of the insulating film.

16. An inlet for an electronic tag according to claim 8, wherein the second portion of the slit extends in a long side direction of the antenna.

17. An inlet for an electronic tag according to claim 16, wherein the chip is disposed at near a junction of the first and second portions of the slit.

18. An inlet for an electronic tag according to claim 1, wherein the chip is disposed at an intermediate lengthwise portion of the slit.

19. An inlet for an electronic tag according to claim 18, wherein the slit is L-shaped and the chip is disposed near a bend of the L-shape.

* * * * *